(12) United States Patent
Takefman et al.

(10) Patent No.: US 11,640,836 B2
(45) Date of Patent: *May 2, 2023

(54) SYSTEM AND METHOD FOR PROVIDING A CONFIGURABLE TIMING CONTROL FOR A MEMORY SYSTEM

(71) Applicant: Rambus Inc., San Jose, CA (US)

(72) Inventors: Michael L. Takefman, Nepean (CA); Maher Amer, Nepean (CA); Claus Reitlingshoefer, Kanata (CA); Riccardo Badalone, St. Lazare (CA)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/372,100

(22) Filed: Jul. 9, 2021

(65) Prior Publication Data

US 2021/0407561 A1    Dec. 30, 2021

Related U.S. Application Data

(63) Continuation of application No. 16/802,073, filed on Feb. 26, 2020, now Pat. No. 11,062,743, which is a continuation of application No. 15/907,390, filed on Feb. 28, 2018, now Pat. No. 10,580,465, which is a continuation of application No. 14/694,487, filed on Apr. 23, 2015, now abandoned.

(60) Provisional application No. 61/983,386, filed on Apr. 23, 2014.

(51) Int. Cl.
*G06F 13/00* (2006.01)
*G11C 7/10* (2006.01)
*G11C 5/04* (2006.01)

(52) U.S. Cl.
CPC .............. *G11C 7/1012* (2013.01); *G11C 5/04* (2013.01); *G11C 7/106* (2013.01); *G11C 7/1066* (2013.01); *G11C 7/1093* (2013.01)

(58) Field of Classification Search
CPC ......... G11C 7/1012; G11C 5/04; G11C 7/106; G11C 7/1066; G11C 7/1093
USPC ......................................................... 711/105
See application file for complete search history.

(56) References Cited

U.S. PATENT DOCUMENTS

| 6,178,518 B1 * | 1/2001 | Toda ..................... G11C 7/1072 |
| | | 713/600 |
| 8,713,379 B2 | 4/2014 | Takefman et al. |
| 10,580,465 B2 | 3/2020 | Takefman et al. |
| 2003/0099149 A1 * | 5/2003 | Braun ................... G11C 7/1051 |
| | | 365/194 |

(Continued)

*Primary Examiner* — Tha-O H Bui
(74) *Attorney, Agent, or Firm* — Lowenstein Sandler LLP

(57) ABSTRACT

A system and method are directed to providing a configurable timing control of a memory system. In one embodiment, the system has a first interface to receive a DIMM clock and configuration information, a second interface to a first data bus, and a third interface to a second data bus. The system further has a plurality of flip-flops, a multiplexor coupled to the plurality of flip-flops, a first control block for controlling to hold an input data within the plurality of flipflops, and a second control block for controlling a timing of an output data from the plurality of flip-flops via the multiplexor with a programmable delay. The input data is received via the second interface. The programmable delay is received via the first interface. The output data is sent out with the timing delay via the third interface.

20 Claims, 14 Drawing Sheets

(56) References Cited

U.S. PATENT DOCUMENTS

2009/0103373 A1\* 4/2009 Shau .................... G11C 7/1066
365/189.02

\* cited by examiner

SYSTEM AND METHOD FOR PROVIDING A CONFIGURABLE TIMING CONTROL FOR A MEMORY SYSTEM

RELATED APPLICATIONS

This application is a continuation of U.S. patent application Ser. No. 16/802,073, filed Feb. 26, 2020, which is a continuation of U.S. patent application Ser. No. 15/907,390, filed Feb. 28, 2018, now U.S. Pat. No. 10,580,465, issued Mar. 3, 2020, which is a continuation of U.S. patent application Ser. No. 14/694,487, filed Apr. 23, 2015, now abandoned, which claim the benefit of U.S. Provisional Patent Application No. 61/983,386, filed Apr. 23, 2014, which are hereby incorporated in its entirety herein by reference.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE DISCLOSURE

The present disclosure relates in general to the field of computers, and in particular, to a system and method for providing a configurable timing control for a memory system.

BACKGROUND

The physical and electrical characteristics of a memory module (e.g., DDR3 RDIMM, unregistered dual in-line memory module (UDIMM), load-reduced dual in-line memory module (LRDIMM)) are governed by various industry standards documents, typically those promulgated by the Joint Electron Device Engineering Council (JEDEC).

Advancements in an ASIC design and the shrinking operational speed of a memory system have caused a signal delay through a co-processor or I/O (CPIO) device and/or a re-timer (RT) device to grow as a significant percentage of the operating period of a computer system. As used herein, a CPIO encompasses a co-processor or an I/O device both of which are well understood terms.

SUMMARY

A system and method for providing a configurable timing control of a memory system is disclosed. According to one embodiment, the system has a first interface to receive a DIMM clock and configuration information, a second interface to a first data bus, and a third interface to a second data bus. The system further has a plurality of flip-flops, a multiplexor coupled to the plurality of flip-flops, a first control block for controlling to hold an input data within the plurality of flip-flops, and a second control block for controlling a timing of an output data from the plurality of flip-flops via the multiplexor with a programmable delay. The input data is received via the second interface. The programmable delay is received via the first interface. The output data is sent out with the timing delay via the third interface.

According to another aspect of the present invention, there is provided a re-timer circuit comprising: a clock generation circuit for receiving a DIMM clock signal and outputting at least one delayed clock signal; a first delay circuit that receives a first data signal and a first data strobe signal and delays the first data signal by a first programmable delay to produce a delayed first data signal, and generates a first output data strobe, with a defined timing relationship between the first delayed data signal, the first output data strobe signal and the DIMM clock signal.

According to yet another aspect of the present invention, there is provided a a method comprising: receiving a DIMM clock signal; based on the DIMM clock signal, outputting at least one delayed clock signal; receiving a first data signal and a first data strobe signal; using at least one of the delayed clock signal, delaying the first data signal by a first programmable delay to produce a delayed first data signal and generating a first output data strobe, with a defined timing relationship between the first delayed data signal, the first output data strobe signal and the DIMM clock signal; transmitting the delayed first data signal and the first output data strobe.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the specification, illustrate the disclosed embodiments and together with the general description given above and the detailed description of the disclosed embodiments given below serve to explain and teach the principles described herein.

Figure 1:
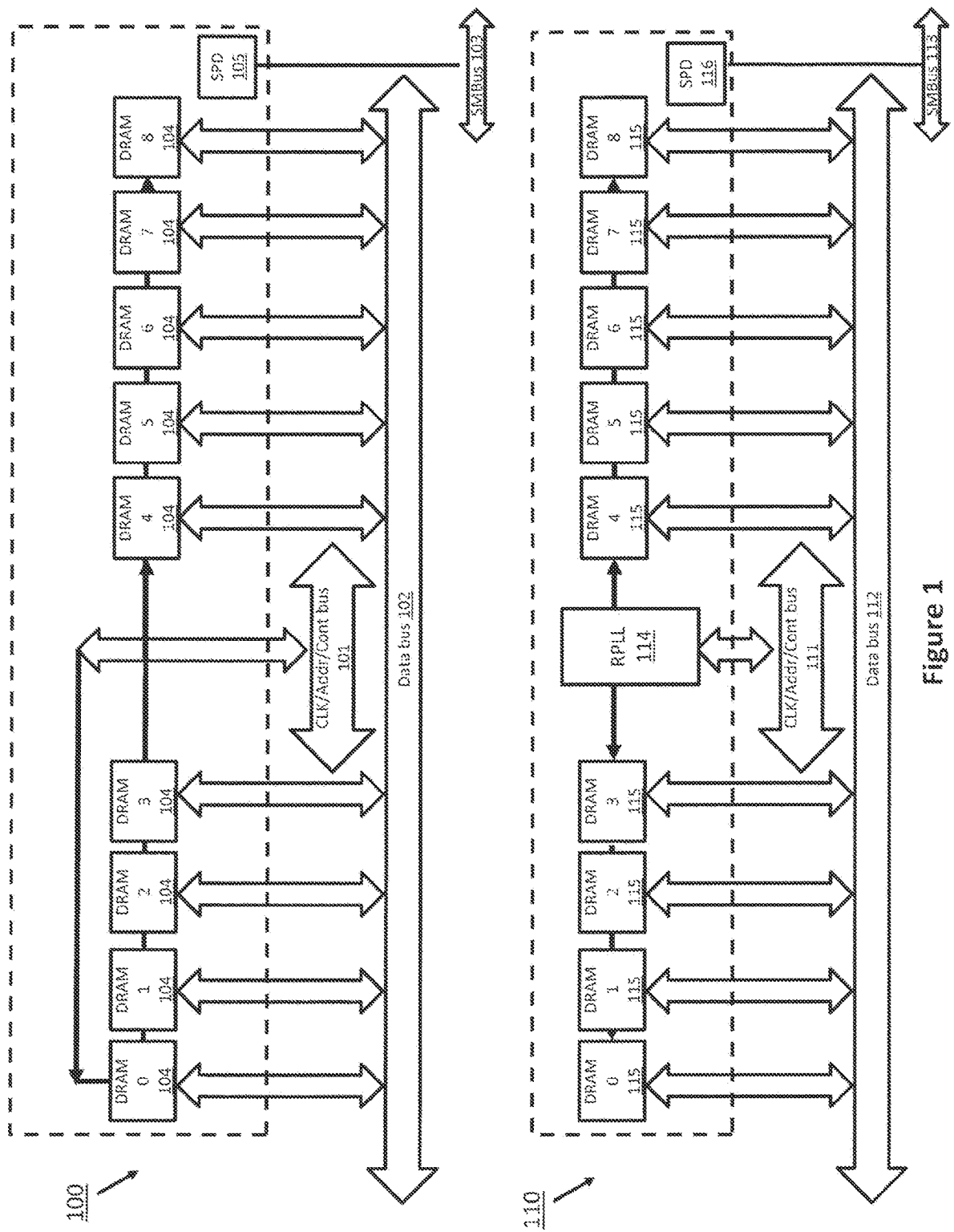
FIG. 1 illustrates an exemplary single rank unregistered dual in-line memory module (UDIMM) and a signal rank registered DIMM (RDIMM), according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Memory systems having a through delay that is longer than one clock cycle or a non-integer number of clock cycles are not typically made to be compatible with the JEDEC standard DIMMs such as a UDIMM, an RDIMM, or a LRDIMM. Methods and systems for providing a configurable timing control are provided that in some embodiments allow for a memory system to be compatible with industry standards.

A method and system for providing a configurable timing control for a memory system is disclosed. According to one embodiment, the system has a first interface to receive a DIMM clock and configuration information, a second interface to a first data bus, and a third interface to a second data bus. The system further has a plurality of flip-flops, a multiplexor coupled to the plurality of flip-flops, a first control block for controlling to hold an input data within the plurality of flip-flops, and a second control block for controlling a timing of an output data from the plurality of flip-flops via the multiplexor with a programmable delay. The input data is received via the second interface. The programmable delay is received via the first interface. The output data is sent out with the timing delay via the third interface.

Each of the features and teachings disclosed herein can be utilized separately or in conjunction with other features and teachings to provide a method for providing a configurable timing control for a memory system. Representative examples utilizing many of these additional features and teachings, both separately and in combination, are described in further detail with reference to the attached drawings. This detailed description is merely intended to teach a person of skill in the art further details for practicing aspects of the disclosed embodiments and is not intended to limit the scope of the claims. Therefore, combinations of features disclosed in the following detailed description may not be necessary to practice the teachings in the broadest sense, and are instead taught merely to describe particularly representative examples of the disclosed embodiments.

In the following description, for purposes of explanation only, specific nomenclature is set forth to provide a thorough understanding of the disclosed embodiments. However, it will be apparent to one skilled in the art that these specific details are not required to practice the disclosed embodiments.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing", "computing", "calculating", "determining", "displaying", or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed embodiments also relate to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present disclosure. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present disclosure is practiced, but not intended to limit the dimensions and the shapes shown in the examples.

The disclosed system and method provides a configurable timing delay to memory devices of a DIMM. The disclosed system and method is applicable, for example, to cases where the RPLL function or re-timing (RT) function has a propagation delay that is larger than one clock cycle or is not restricted to an integer number of clocks. Furthermore, the disclosed system and method provides a timing control for a new type of DIMM. This may allow the MINIM to be compatible with one or more existing topologies of DIMMs such as UDIMM, RDIMM, or single buffer LRDIMM. In addition, the disclosed system and method is applicable to a DIMM using a single centralized RPLL, a buffer, a distributed re-timer architecture, or a distributed buffer architecture.

A computer system typically includes a central processing unit (CPU), a main memory unit including one or more dynamic random access memory (DRAM) devices, and one or more co-processor or I/O (CPIO) devices such as a video card, a sound card, a hard drive, and a solid state drive (SSD). These components are connected together via buses on a motherboard of the computer system.

FIG. 1 illustrates an exemplary single rank unregistered DIMM (UDIMM) and a signal rank registered DIMM (RDIMM), according to one embodiment. A host sends command/address/clock signals to DRAMs 104 via the clock/address/control bus 101. For a read operation, DRAMs 104 sends data on the target address back to the host via data bus 102. For a write operation, the host sends the write data to DRAMs 104 via data bus 102. UDIMM 100 includes a serial presence detect (SPD) 105 and advertises itself as a UDIMM to a host over a system management bus (SMBus) 103.

In the UDIMM 100, command/address/clock signals on the clock/address/control bus 101 follow a relatively long route so that the signal path remains a single trace to improve the signal integrity. This causes a temporal distribution of the DRAMs 104 with an increasing delay from one end of the UDIMM 100 to the other end. For example, DRAM 0 has the shortest delay and DRAM 8 has the longest delay. The typical delay through a PCB of the UDIMM 100 is in the range of 160-180 ps. A DRAM 104 of the UDIMM 100 requires that a write data strobe signal arrives within a time window around rising and falling edges of the signal clock. The read data strobe is driven out within another time window around rising and falling edges of the signal clock. If the distance to the gold fingers of the UDIMM 100 were 0, the read and write data strobes would be co-incident. In practice, as the distance from DRAMs 104 to the gold finger increases, the write data strobe arrives earlier and the read data strobe arrives later. However, because the path lengths between all of DRAMs 104 with their respective gold fingers are the same, the relative timing relationship remains the same regardless of the byte lane.

In a RDIMM 110, the register phase-locked loop (RPLL) 114 re-times the command/address/clock signals on the clock/address/control bus 111 and drives the signals to DRAMs 115. This causes a temporal distribution of DRAMs 115 with an increasing delay outwards from the center of the RDIMM 110 to the ends. For example, DRAM 3 and DRAM 4 have the shortest delay while DRAM 0 and DRAM 8 have the longest delay. The relationship for read and write data strobes are co-incidental at DRAMs 115 and slightly spread at the gold fingers.

RDIMM 110 includes a SPD 116 and advertises itself as a RDIMM to a host over an SMBus 113. A host sends command/address/clock signals to DRAMs 115 via the clock/address/control bus 111. For a read operation, DRAMs 115 send data on the target address back to the host via data bus 112. For a write operation, the host sends the write data to DRAMs 115 over data bus 112.

Figure 2:
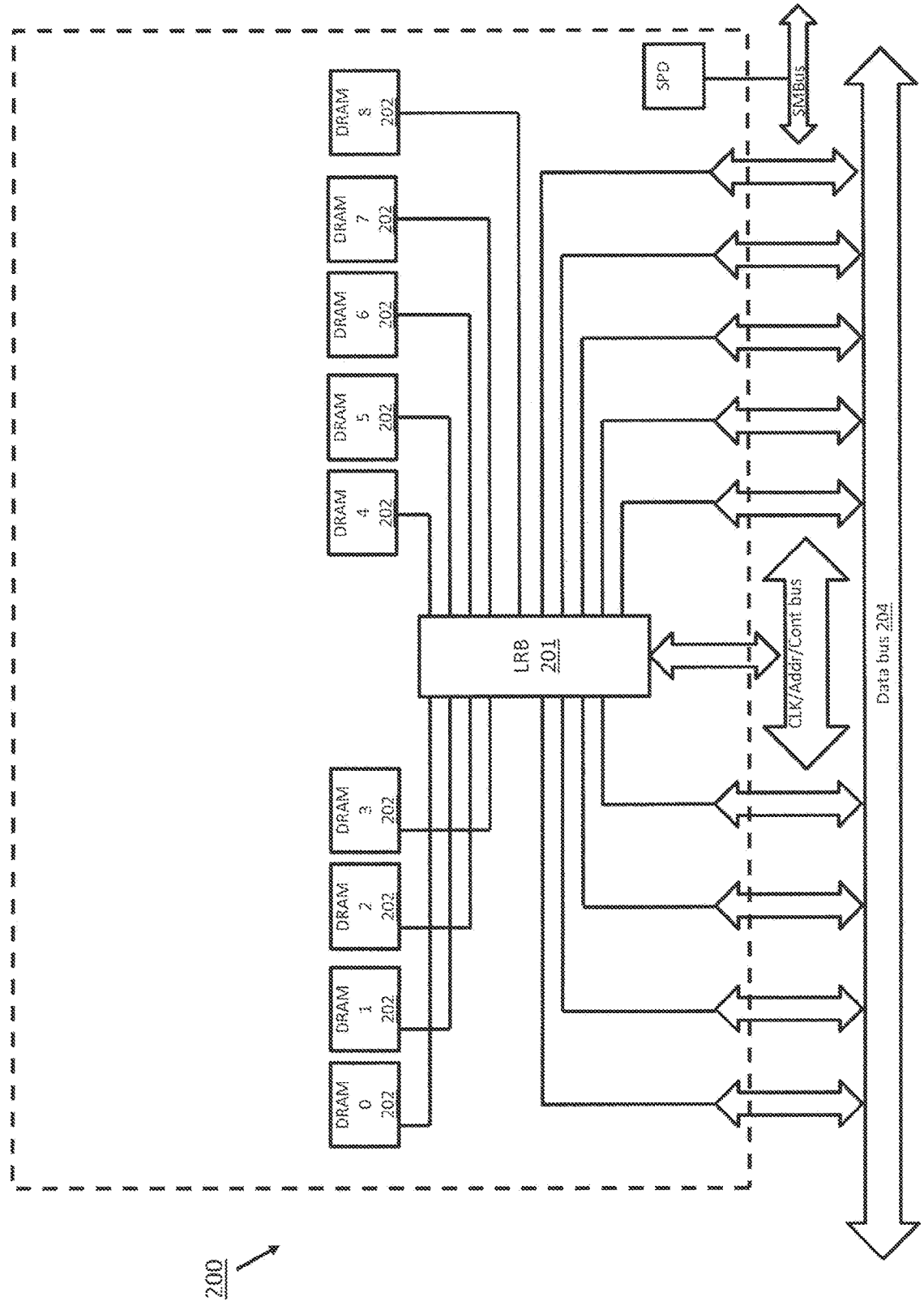
FIG. 2 illustrates an exemplary load-reduced DIMM (LRDIMM), according to one embodiment.

FIG. 2 illustrates an exemplary load-reduced DIMM (LRDIMM), according to one embodiment. LRDIMM 200 is a JEDEC compliant single buffer DDR3 LRDIMM and has different delay characteristics from either a UDIMM 100 or an RDIMM 110 due to a longer path length of data lines from the gold fingers to the load-reduced buffer 201. Assuming the load-reduced buffer 201 connecting the data bus 204 to DRAMs 202 uses a single clock phase for all of the host side byte lanes, the following timing relationships are valid. For a read operation, data strobes exit the gold fingers of the LRDIMM 200 later in time similar to an RDIMM 110 because the total path length for a given byte lane is almost the same, and the data strobes leave the load-reduced buffer 201 at the same time as the clock would be sent from an RPLL 114 of the RDIMM 110. However, the timing of a write operation is significantly different. In a load reduced buffer 201, the write levelling point is the same for all byte lanes at the load-reduced buffer 201 due to the single clock phase used for all byte lanes. This requires that data at the farthest byte lanes (e.g., DRAM 0 and DRAM 8) arrive at the gold fingers earlier in time so that they can propagate to the load-reduced buffer 201 and arrive at the same time via differing path lengths.

Figure 3:
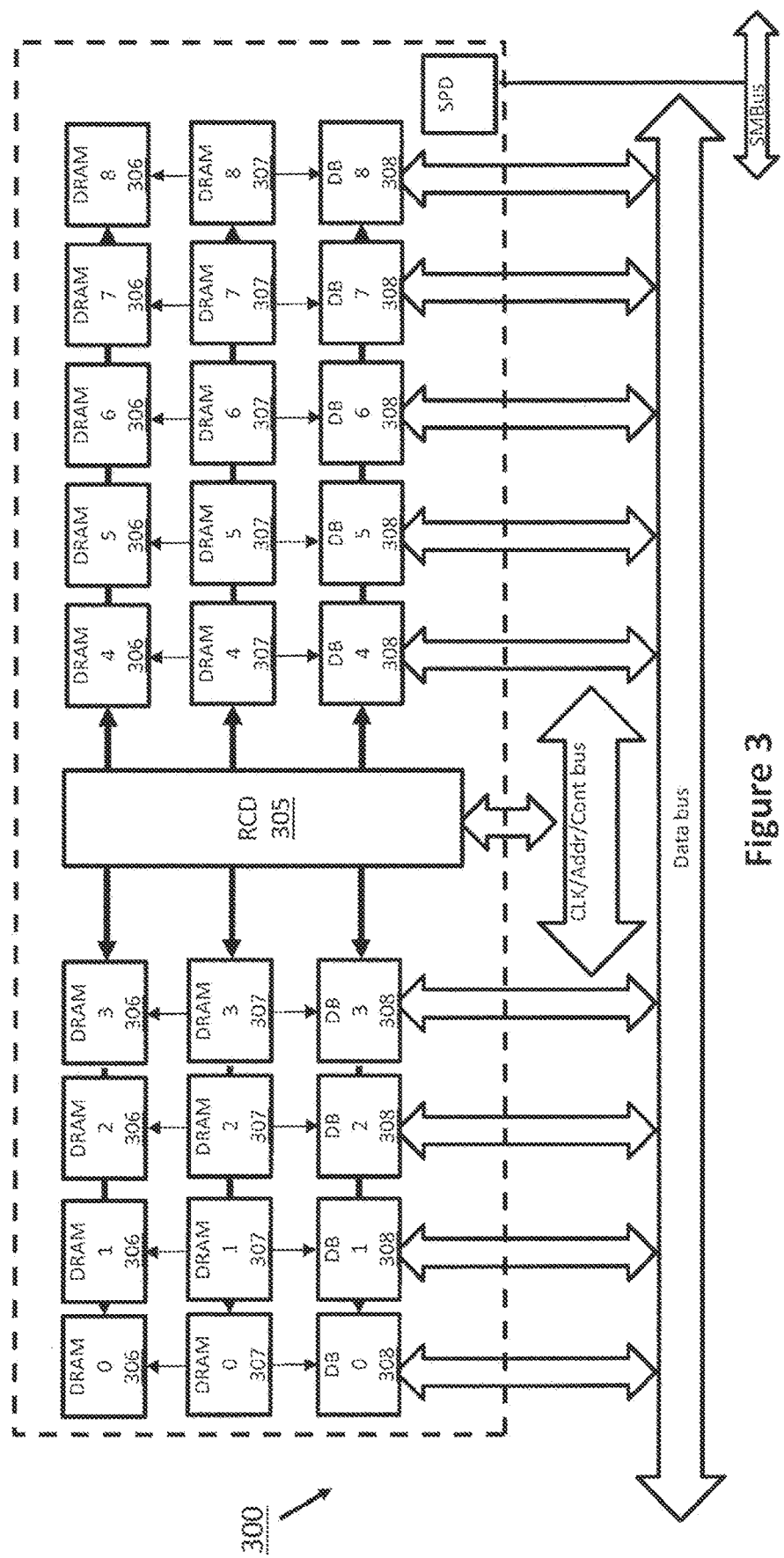
FIG. 3 illustrates an exemplary LRDIMM using a distributed architecture, according to one embodiment.

FIG. 3 illustrates an exemplary LRDIMM using a distributed architecture, according to one embodiment. LRDIMM 300 has 4 ranks of DRAM devices, which are shown as dual die DRAM packages 306 and 307. In addition to having a register control device (RCD) 305, the LRDIMM 300 includes data buffers (DB) 308. While the temporal distribution of the DRAMs is similar to that of the DRAMS in a RDIMM, the addition of the DBs 308 causes the temporal distribution at the "gold fingers" (i.e., the pins of the DIMM for connecting to the host computer system) to be different. Because of the propagation delay of the data signals through the DBs 308, the LRDIMM 300 has a different delay characteristic from that of a RDIMM. The data buffers may be as defined in the JEDEC DDR-4 LRDIMM standard.

Figure 4:
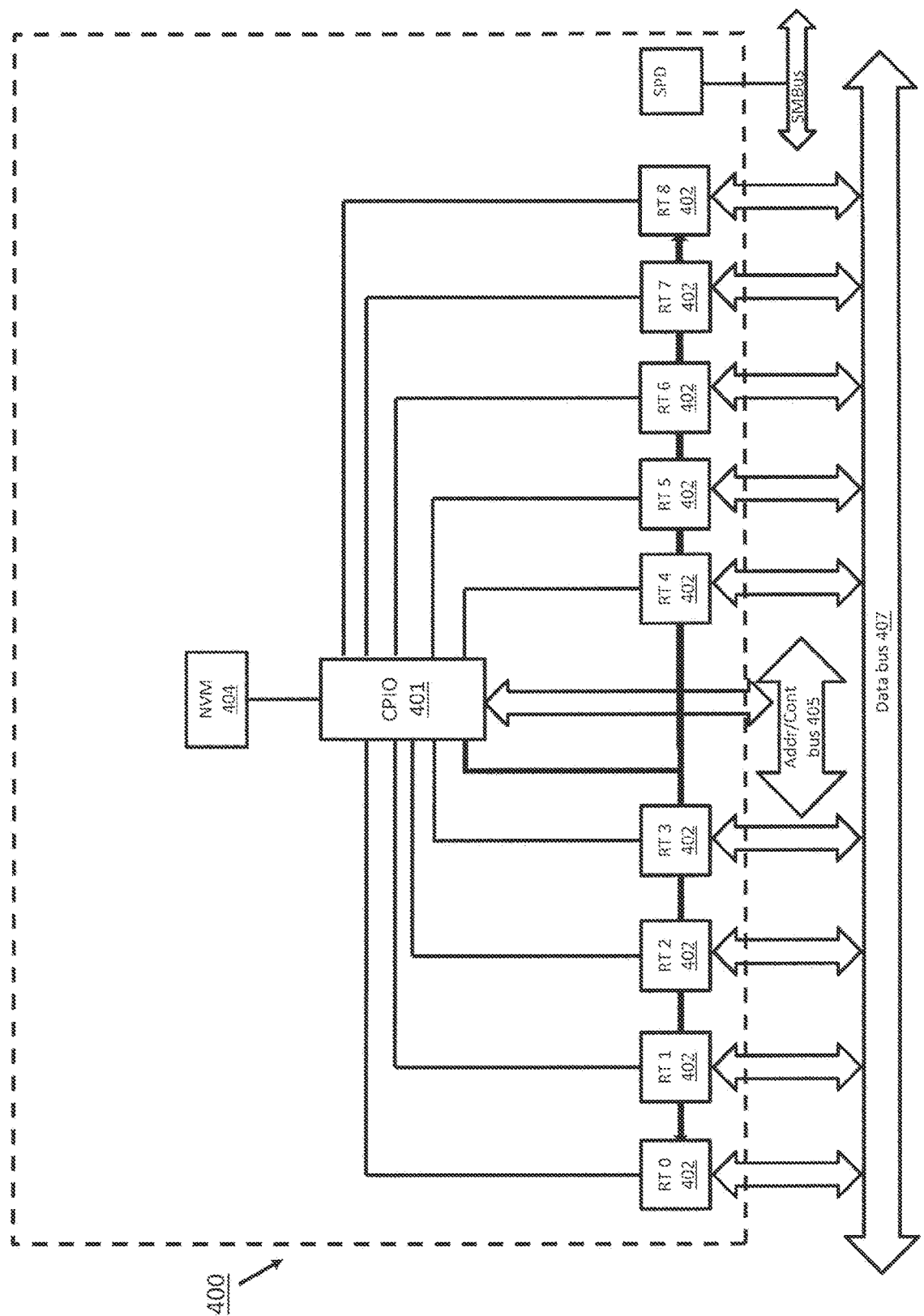
FIG. 4 illustrates an exemplary co-processor or I/O (CPIO)-based dual in-line memory module (DIMM) with re-timer (RT) devices, according to one embodiment.

FIG. 4 illustrates an exemplary co-processor or I/O (CPIO)-based dual in-line memory module (DIMM) with re-timer (RT) devices, according to one embodiment. A CPIObased DIMM 400 has a CPIO device 401 that is connected to a non-volatile memory 404 and a corresponding plurality of RT devices 402. Each RT device 402 receives address/control signals via address control bus 405 with a delay relative to the signal exiting the CPIO device 401 in a similar manner to a DRAM 115 of an RDIMM 110 relative to the signal exiting the RPLL 114 as explained with respect to FIG. 1. However, the RT device 402 has an intrinsic delay (e.g., a propagation delay) from the signal arriving on one side to exiting the other side in addition to any delays from the CPIO device 401. For the embodiment of FIG. 4, the re-timer devices 402 may, for example, be re-timer circuits that implement a fixed, non-programmable delay, for example a JEDEC compliant re-timer circuit. In such a case, the CPIO is equipped with programmable timer circuits, such as described below by way of example with reference to FIG. 11, having programmable delay. The programmable delay is set such that the combination of the fixed delay and the programmable delay result in the required timing. The delay through the system will include the programmable delay of re-timer circuits in the CPIO, fixed trace delay from the CPIO to the re-timer circuits 402, fixed trace delay from the data buffers to the data bus 502, in combination with the fixed delay introduced by the re-timer circuits 402. By suitably programming the delay in the programmable re-timer circuits, this embodiment can be made to behave, from a timing perspective, substantially like an RDIMM or an LRDIMM. Alternatively, the re-timer devices 402 of FIG. 4 may include re-timer functionality such as described with reference to FIG. 11 by way of example. In such a case, the CPIO may also include such re-timer circuits.

Figure 5:
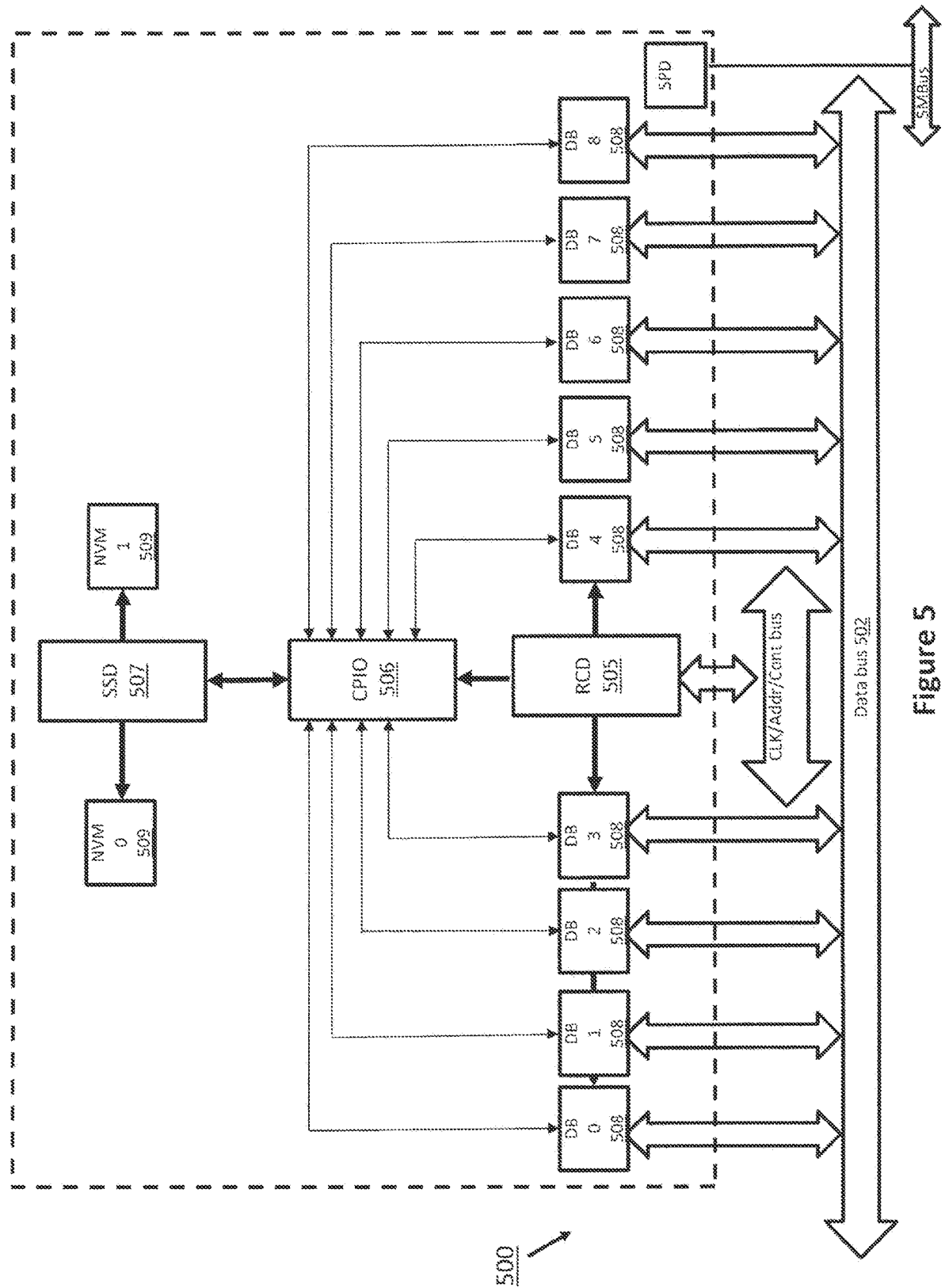
FIG. 5 illustrates an exemplary co-processor or I/O (CPIO)-based dual in-line memory module (DIMM) with a standard JEDEC DDR-4 register control device (RCD) and Data Buffers (DB), according to one embodiment.
Figure 11:
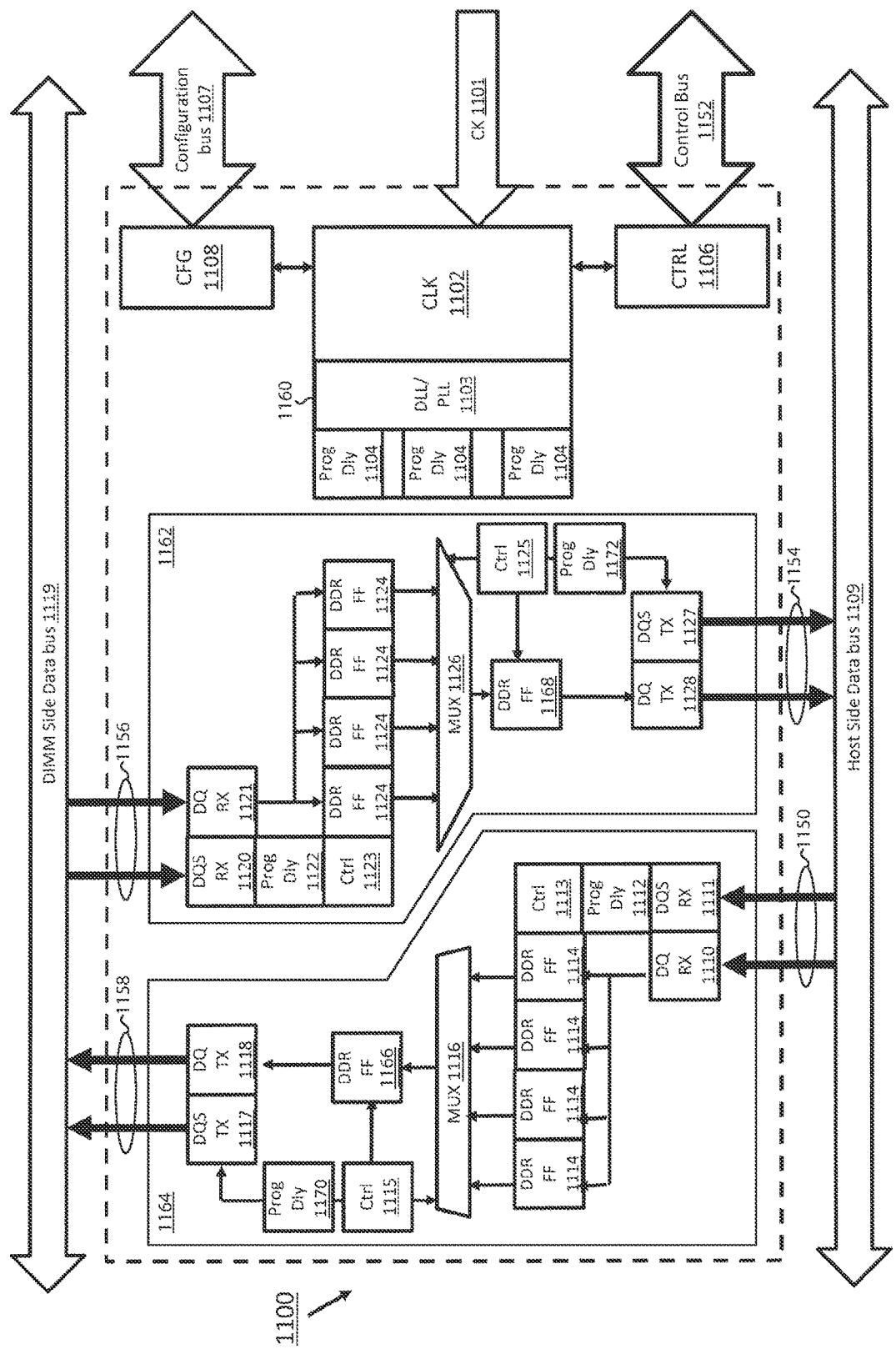
FIG. 11 illustrates a schematic diagram of an exemplary RT device with a timing control for both a host side and a DIMM side, according to one embodiment.

FIG. 5 illustrates an exemplary co-processor or I/O (CPIO)-based dual in-line memory module (DIMM) with a standard JEDEC DDR-4 RCD and Data Buffers (DB), according to one embodiment. Differing from the modules shown in FIG. 3, the CPIO device 500 does not have DRAM devices. Instead, the CPIO device includes a CPIO ASIC 506, a solid-state drive (SSD) controller 507, and non-volatile memory (NVM) devices 509. The CPIO ASIC 506 is centralized and placed near the RCD 505 and receives a clock signal that is similar in time to the closest DRAM devices of an RDIMM design. The trace lengths from the CPIO ASIC 506 to the DBs 508 are also similar to those between the RCD 505 to DB 508. Note that the function of a CPIO LRDIMM is not restricted to any particular application, but for the purpose of illustration here, the CPIO LRDIMM is shown as a non-volatile storage DIMM (i.e., a solid state disk drive). For the embodiment of FIG. 5, programmable re-timer circuits such as described below, an example of which is depicted in FIG. 11, are implemented within the CPIO. The delay through the system will include both the delay introduced by the programmable re-timer circuits, trace delay from the CPIO to the data buffers 508, and trace delay from the data buffers to the data bus 502, in combination with delay through the data buffers 508. By suitably programming the delay in the programmable re-timer circuits, this embodiment can be made to behave, from a timing perspective, substantially like an RDIMM or an LRDIMM.

Figure 6:
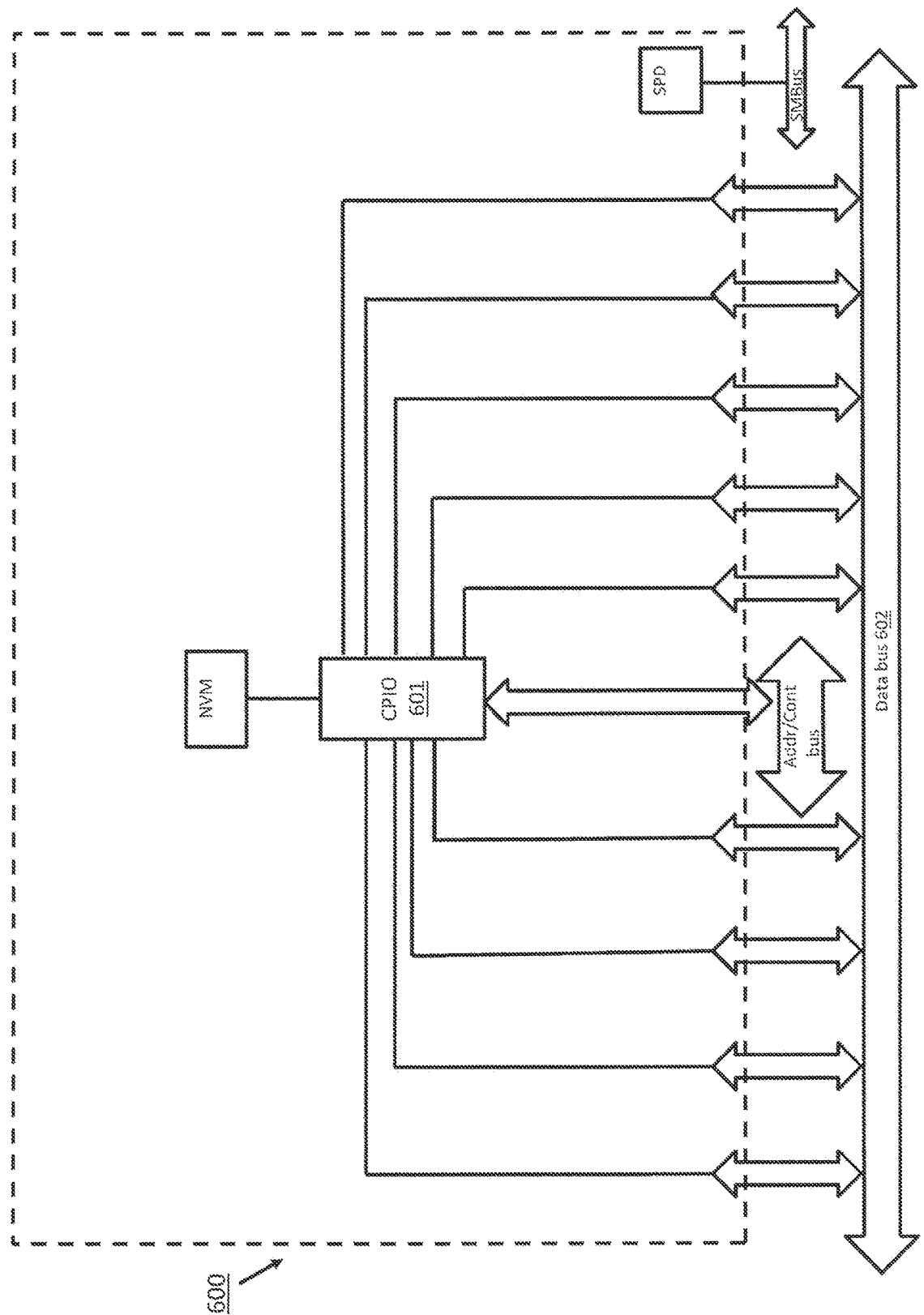
FIG. 6 illustrates an exemplary CPIO-based DIMM without an RT device, according to one embodiment.

FIG. 6 illustrates an exemplary CPIO-based DIMM without a separate RT device, according to one embodiment. Because address and control signals are not re-timed using external re-timers, the CPIO-based DIMM 600 consumes less power compared to the circuit of FIG. 5, for example, but the signal integrity may be compromised as a result. Due to a longer track length, any reflections that are not properly terminated could change the channel's characteristics and cause the CPIO-based DIMM 600 to behave like an LRDIMM rather than an RDIMM or a UDIMM. However, by including a timing control, the CPIO-based DIMM 600 can be made to be timing compatible with JEDEC standard UDIMMs, RDIMMs or LRDIMMs. It is noted that a JEDEC DDR-4 RCD could be inserted between the gold fingers and the CPIO device. For the embodiment of FIG. 6, programmable re-timer circuits such as described below, example of which is depicted in FIG. 11, for example, are implemented within the CPIO 601. The delay through the system will include both the delay introduced by the programmable re-timer circuits, trace delay from the CPIO to the data bus 602. By suitable programming the delay in the programmable re-timer circuits, this embodiment can be made to behave, from a timing perspective, substantially like a UDIMM, RDIMM or an LRDIMM.

According to one embodiment, the disclosed system and method provides a timing control of a CPIO device (which may be fixed or programmable, as described above with reference to FIG. 4) and an RT device (which may be fixed or programmable), or a CPIO device alone that includes programmable RT functionality. FIG. 4 is an example of a CPIO device with an RT device, and FIGS. 5 and 6 are examples of CPIO devices per se that include RT functionality. According to one embodiment, the timing control is configurable to mimic the timing of LRDIMMs and UDIMMs. As a result, the timing control allows one type of a memory module to appear as another type of a memory module. For example, an LRDIMM (distributed or centralized) having a timing control according to the disclosed system and method can be configured to appear as a RDIMM or a UDIMM.

According to one embodiment, the timing control of a CPIO device and/or an RT device is performed by a clock delay function. The clock delay function does not assume a particular circuit implementation (e.g., a phase-locked loop (PLL), a delay-locked loop (DLL), a phase interpolator), and any timing control scheme for controlling a clock phase may be used without limiting the scope of the disclosed system and method. As such, it is noted that the disclosed system and method is applicable to a timing control scheme for any type of memory modules regardless of the circuit design technique that is employed.

The clock delay through a RPLL is a function of two timing parameters: the propagation delay, tPDM, of command/address signals, and the static offset, tSTAOFF, from the input clock to the output clock. tSTAOFF-tPDM is 1/2 a clock period for a normal operation. tPDM typically ranges from 0.6 ns to 1.2 ns and is a function of the critical path for the propagation of the command/address signals through the RPLL.

In a typical RDIMM, the RPLL adds approximately a single clock of delay to the operation of the DIMM, i.e., the command and output clock are delayed such that the overall operation is delayed by approximately one clock cycle. The DRAM responds in an integer number of clocks with some uncertainty around the clock edge. The propagation delay of the signals to/from the DRAM/RT device and CPIO device/RPLL can be ignored as being equivalent. The DRAM drives the data at or near the clock edge subject to some variability as per the DRAM specifications. The RT device receives the data and propagates the received data in some of integer number of clocks to maintain compatibility with another RDIMM. By generalizing an integer number of delay clocks, the disclosed system and method employs a larger integer number of clocks through an RT device by providing a modification value of +IN, where N is the number of clocks of delay.

If the RPLL function of a CPIO (or RPLL) requires a substantially larger tPDM, the tPDM is increased by an integer number of clock periods, ideally the smallest number of clock periods. In this scenario, the modification value increases by +/−M, where M is the number of additional clock periods.

In the case where a delay through the RT device is not an integer number of clocks but an absolute time, the disclosed system and method may substantially minimize the effective latency for a given design of the DIMM. For a DIMM without a DRAM, the CPIO device is responsible for getting the data to the RT device such that data can propagate through the CPIO device and exit the CPIO device at a rising clock edge. To accomplish this, the data strobe arrives via data bus 407 with a delay through the RT device, tPDRT seconds before the rising edge of the clock at the RT device so that the data can flow through the CPIO device and be out of the RT device at the rising edge. This requires that the exact timing when the data is launched by the CPIO may be different for each RT device due to the path/delay difference between the signal path of the clock, command, address to the RT device, and the data path for each RT device. For a write operation, the host has a valid window of time where the data can arrive. In a worst case, the data arrives at the end of the valid window of time and propagates through the RT device in tPDRT and then propagates to the CPIO device. In the case where no DRAM is present on the DIMM, the CPIO device is capable of receiving the data at a different time per byte lane.

Figure 7:
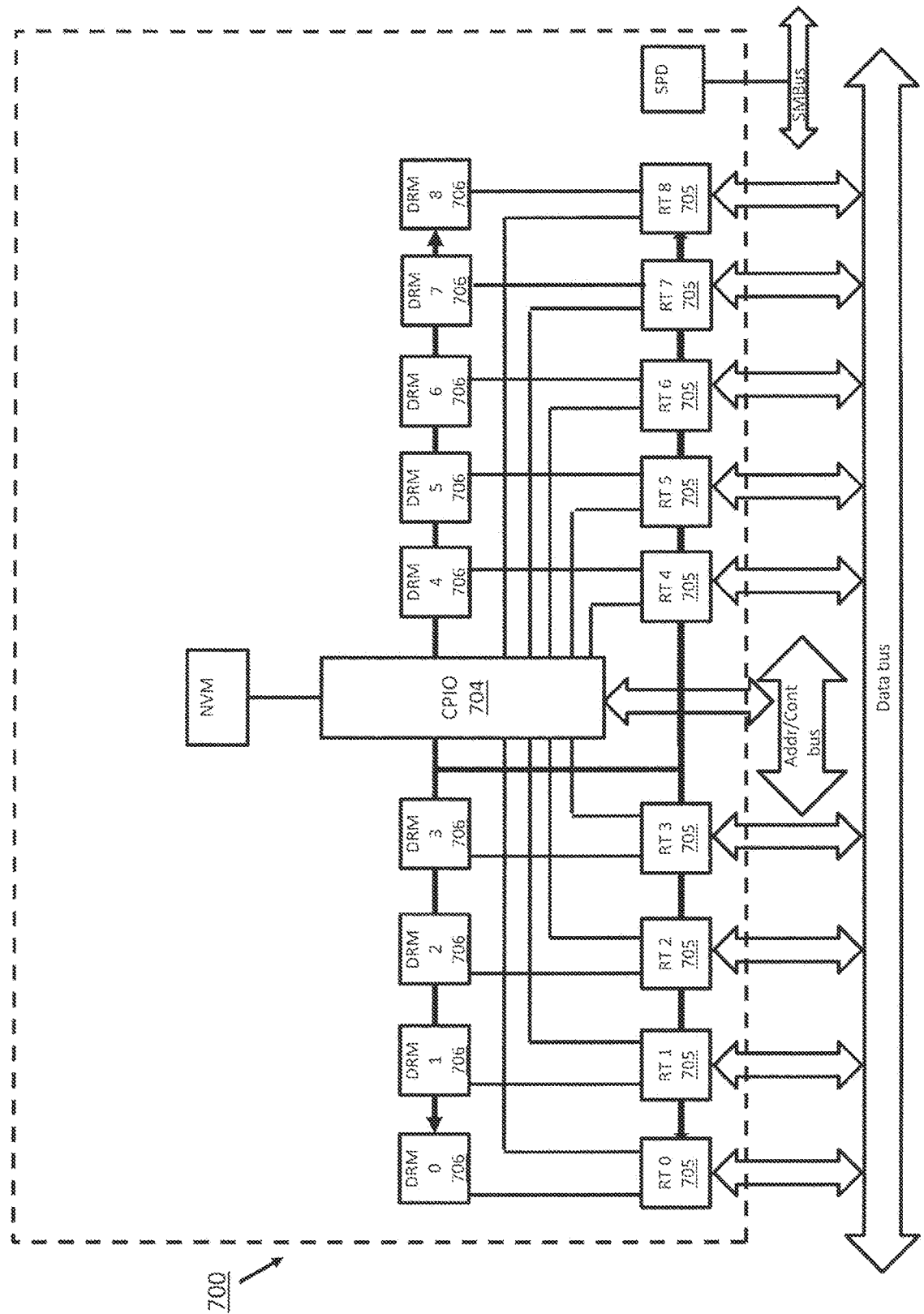
FIG. 7 illustrates an exemplary CPIO-based DIMM with RT devices, according to one embodiment.

FIG. 7 illustrates an exemplary CPIO-based DIMM with RT devices, according to one embodiment. The DIMM 700 has a CPIO device 704 and a rank of DRAMs 706. It is noted that the rank of DRAMs 706 is not required for a CPIO and is shown to improve understanding and illustration of the principle and comparison of timing between a "typical DIMM with DRAM and a CPIO without DRAM. It is noted that a JEDEC DDR-4 RCD could be inserted between the gold fingers and the CPIO device and the RT devices replaced with a DDR-4 DB device.

Each of the DRAMs 706 is connected to a corresponding RT device 705. In the case where DRAMs are on a DIMM such as DIMM 700, minimizing the effective latency is difficult to achieve due to the fact that the DRAM specification provides for a wide range of output delays for read data and a specific window of time for write data. The clock received at the DRAMs 706 is quite close in phase to the clock received at the corresponding RT devices 705, and the propagation delay is quite small. In the worst case when the output delay on read operations added to the tPDRT indicates when the data is available, the DIMM 700 may not be compatible with an RDIMM because the delay may not be within a valid output window, and the delay of the RT device 705 is increased such that the total delay is within the valid output window.

In determining whether the delay is within a valid output window, it is assumed that the worst case delay through the RT device and CPIO device is known. Although significantly more complicated, it is possible to characterize all of the RT devices on a memory module and determine that the actual delay through the memory module is lower. If the amount of delay is significant, at some clock frequencies, it might be possible that the lower value translates into a saving of a clock of latency To accommodate a more realistic delay, the CPIO-based memory module 700 implements a propagation delay through a quasi-RPLL function of approximately tPDM+1.5 clocks and a maximum data path delay through the RT function of approximately 2.5 nanoseconds, thus providing a final delay of between 3 and 4 clocks for the system that runs between DDR-800 and DDR-1600 speeds. In one embodiment, the CPIO device itself provides internal data to its DDR-3 slave PHY and exits the device in slightly over 10 ns with a tPDM of 3.7 ns. This allows the final solution to achieve a read latency of 6 clocks at DDR-800 and 10 clocks at DDR-1600. The RT device receives its commands 1 clock cycle later than a DRAM on a typical RDIMM, and hence adjusts its column address strobe (CAS) latency (CL) and CAS write latency (CWL). The CPIO launches data 1 or 2 clock cycles earlier (or receives it later) than programmed, and hence adjusts its CL and CWL by 1 or 2 depending on the speed.

The placement and stability of the clock in a DDR3 or DDR4 system is critical in making a system to operate properly. The memory controller may use a training method to characterize the DIMMs and determine a number of timing parameters relative to the system clock. In general, the timing parameters and delays are controllable in terms of integer clock cycles and a sub-phase within a clock. According to one embodiment, for training a memory module, the memory controller configures the following parameters:

T1: drives commands to the DIMM relative to the output clock (global);
T2: enables receivers for read commands relative to the output clock (per byte/nibble lane);
T3: drives data for write commands relative to the output clock (per byte/nibble lane); and
T4: drives the on-die termination (ODT) signal to one or more DIMM ranks to improve signal integrity (SI) (global or per byte/nibble lane).

Given the architecture/features of the memory module hardware, the CPIO device may have an effective control over items T2, T3 and T4 because of host training. Item T1 does not need a special handling by the CPIO device.

In general, a DRAM has a DLL that is used to guarantee the placement of an internal clock relative to an input clock so that read and write timing operations have a lower sensitivity to the process voltage and temperature. The DRAM DLLs are relatively simple and there is no need for a programmable capability. In order to keep the cost of DRAMs as inexpensive as possible, it is desirable to minimize the complexity of DRAMs. For a read operation, a DRAM uses its DLL to create an output clock but does not have a capability to adjust the time. Therefore, in a UDIMM or an RDIMM, data exits the DRAM within a window of time around a rising edge of a clock, and the specification for that window is quite large. When using an RT device, the RT itself naturally mimics the timing of an RDIMM or an LRDIMM due to the similar clock distribution on the DIMM. In this scenario, the CPIO device controls its launch times to arrange for data to arrive at the RT device just in time. This CPIO capability may be used without an RT device to allow a CPIO device to mimic any DIMM timing. Notably, to do a read leveling, the CPIO device supports the multi-purpose register (MPR) function of a DRAM that creates a known data sequence to support read levelling operation. By placing the DEV IM into a read levelling mode and then performing a series of read operations, the host determines the correct timing for turning on the receivers.

There is a large output window allocated to a DRAM with respect to a read launch time, therefore the host cannot infer anything about write levels from read levels. The host memory controller determines the correct time to launch data to the DIMM using write levelling. According to one embodiment, write levelling can be supported using two methods. The first method is when the host uses the write levelling feature of the DRAM. The second method is when the host has first determined read levels and performs a series of writes and read backs to determine the write timing. In a write levelling mode, the clock is sampled when the incoming data strobe (DQS) transitions from 0 to 1, and the result is driven back to the memory controller on the DQ signal line(s). The host adjusts the output timing of DQS until it finds the 0 to 1 transition of the DQ line. The delay setting corresponds to when the clock is rising, and for standard DDR DRAM parts corresponds to when the data is supposed to arrive at the device. Typically in a DRAM, a DLL is used to remove an insertion delay of the clock so that the output clock (for read operations) is nominally aligned to the input clock (controlling item T2 above).

The DLL is not required to correctly sample write data as the DRAM receives a DQS so the clock is not used to sample the data. The clock is used to enable the receivers in a reasonable window so that the DQS and the data can be sampled. However, the addition of a programmable delay element allows the clock to be shifted during a write levelling mode and to shift the receive enable signals. By adjusting the delay, the host can be forced to have data arrive earlier or later (controlling item T2 above) regardless of which levelling mode is used. Notably, there is no requirement for additional clock paths in the design and that the timing capability is placed in the RT device if it is used. If the RT device is not used, the CPIO device has the timing capability. By having an acceptable range and precision on a programmable delay (e.g., one full clock cycle in N equal steps) the write levelling point can be placed anywhere such that the effective timing can mimic any type of memory modules.

When using an RT device, in order to mimic a UDIMM, each RT device requires an individual offset so that an increasing delay from side to side can be adjusted. Typically, the CPIO device drives out two clocks (left and right). If additional clock pins are available (one per RT device), the CPIO device adjusts the individual clocks to the RT devices and avoids the additional clock control.

If there is a desire to be able to adjust the ODT operation, the adjustment by an integer number of clocks is merely a pipelining issue. Adjustment by one half a clock is merely the use of a negative edge flip flop in addition to a positive edge flip flop and a multiplexor to select a clock signal to use. However, if greater precision is required, an addition programmable PLL/DLL output tap is added.

According to one embodiment, a CPIO device has the following controllable timing features:

C1: control of the output clock phase to the RT devices;
C2: control of the receiver enable phase for each DDR lane (write operations) and control of the write levelling clock for each DDR lane (write levelling operation); and
C3: control of the launch time for each DDR lane (read operations).

Note that the functionality to allow controllability of C1, C2 and C3 within a CPIO device can be implemented using a RT circuit, such as described herein. For example, assuming the CPIO device includes a re-timer circuit similar to that of FIG. 11 described below, controlling C1 is achieved by controlling the clock into block 1125, controlling C2 is achieved by controlling the clock into block 1123, and controlling C3 is achieved by controlling the clock into block 1115.

According to one embodiment, an RT has the following controllable timing features:

R1: control to adjust the nominal arrival of the clock from the CPIO (for UDIMM compatibility);
R2: control of the receive enable phase for each host side DDR lane, and control of the write levelling clock for the host side DDR lane;
R3: control of the launch time for each host side DDR lane; and
R4: control of the receive enable phase for each CPIO side DDR lane.
R5: control of the launch time for each CPIO side DDR lane Item R1 provides UDIMM-compatible timing and contains a delay element to move the clock to a position that is equivalent to the arrival of the clock on the UDIMM. Items R2 and R3 provide LRDIMM or UDIMM compatible timing. Items R4 and R5 are needed when an RT port is connected to a DRAM as the DRAM cannot adjust its timing and the RT device adjusts the timing If the RT device is connected to a CPIO with a timing control, the control over the receive enable and launch times are reduced to ensure an offset between the nominal input clock on both sides of the RT device that is equal to the propagation delay through the RT device. The reduction of launch times is possible because the CPIO device can ensure that data arrives at the CPIO device exactly when it is needed, and can accept data from the RT device whenever it would naturally arrive.

Where the re-timer circuit is implemented using a circuit similar to FIG. 11 described below, R1 through R5 can be related to the functionality of FIG. 11 as follows R1 is an overall adjustment to the clock 1101 that is done prior to all other adjustments. Alternatively, it can be rolled into the other adjustments.
R2: control of the receive enable phase for each host side DDR lane, and control of the write levelling clock for the host side DDR lane. This can be achieved through the clock used in block 1113.
R3: control of the launch time for each host side DDR lane. This can be achieved through the clock used in block 1125.
R4: control of the receive enable phase for each CPIO side DDR lane. This can be achieved through the clock used in block 1123.
R5: control of the launch time for each CPIO side DDR lane. This can be achieved through the clock used in block 1115.

Figure 8:
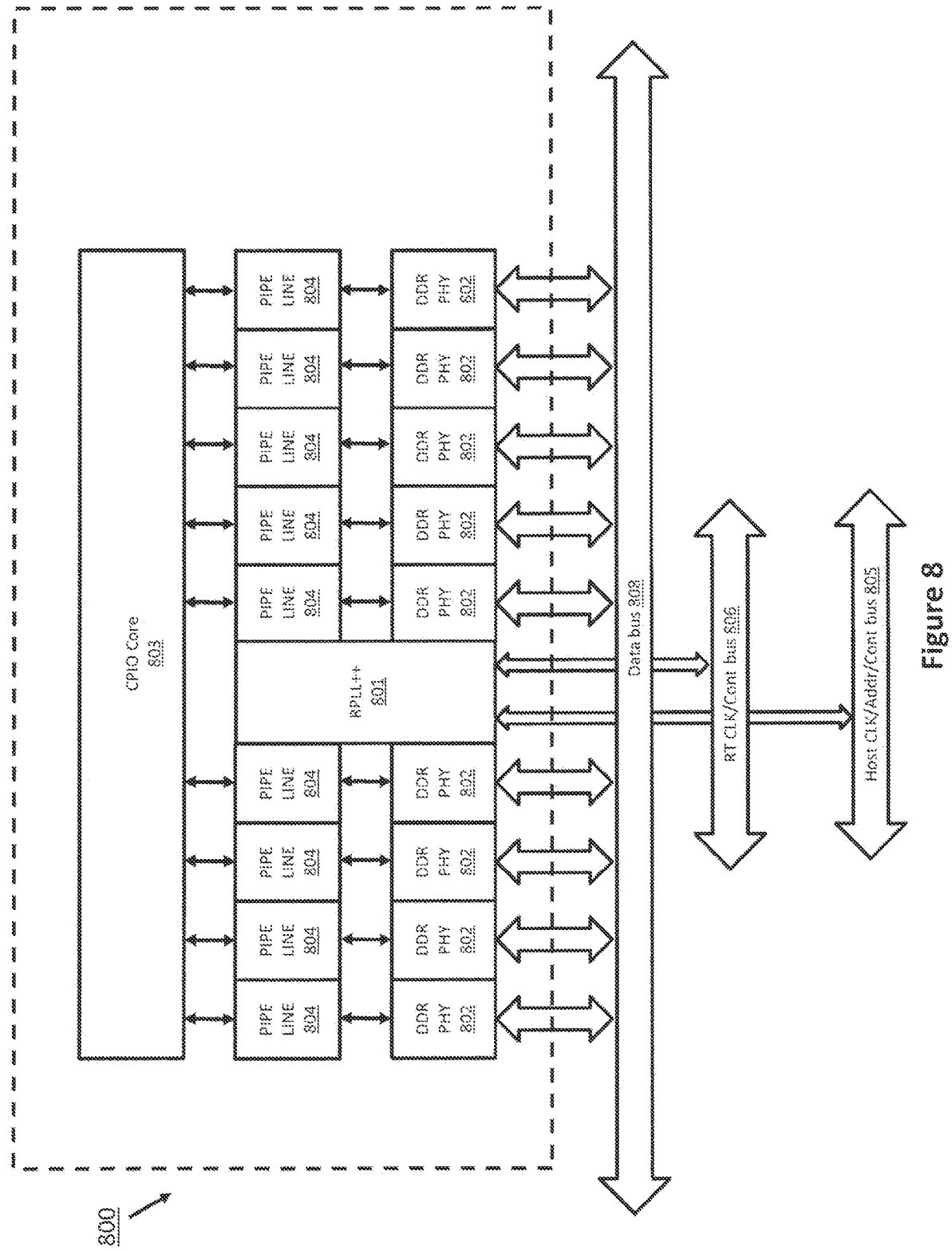
FIG. 8 illustrates a schematic diagram of an exemplary CPIO device, according to one embodiment.

FIG. 8 illustrates a schematic diagram of an exemplary CPIO device, according to one embodiment. A CPIO 800 has a CPIO core 803, RPLL++ 801, and pipelines 804 that are connected to the CPIO core 803 and the corresponding DDR PHY blocks 802s. Each DDR PHY block 802 is connected to data bus 808, and RPLL++ 801 is connected to both RT clock and control bus 806 and host clock/address/control bus 805. According to one embodiment, the internal pipelines 804 are used as a load-reduced buffer. An RPLL++ refers to the functionality of a standard or conventional RPLL that might be present in an industry standard RCD device, optionally plus some extra functionality. The programmable RT functionality in FIG. 8 is done using the pipeline and DDR-PHY blocks.

Figure 9:
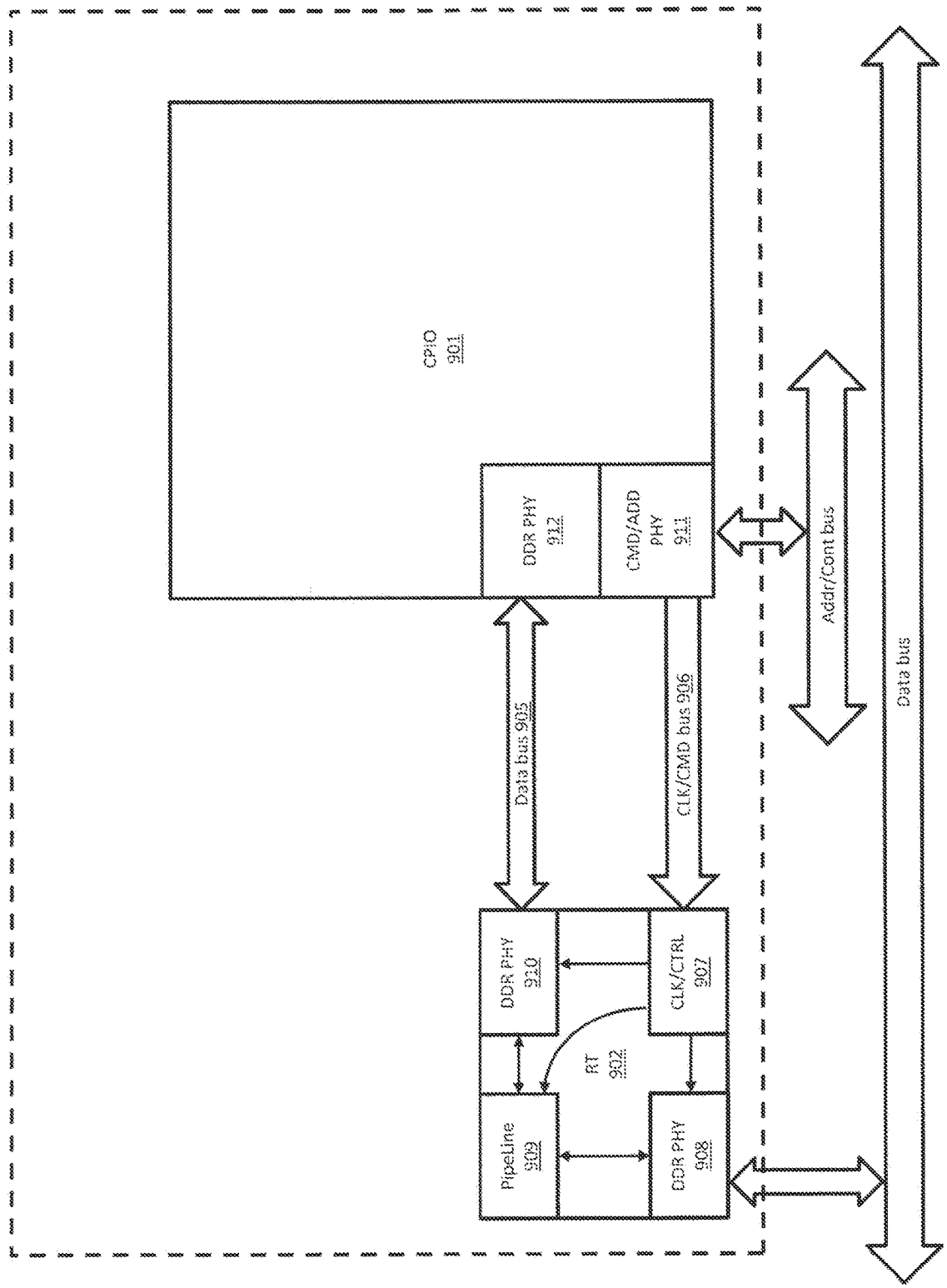
FIG. 9 illustrates a schematic diagram of a CPIO and an RT, according to one embodiment.

FIG. 9 illustrates a schematic diagram of a CPIO 901 and an RT 902, according to one embodiment. CPIO 901 has DDR PHY 912 and command/address PHY 911 connected to RT 902 via data bus 905 and clock/command bus 906. The RT device 902 in this embodiment includes DDR PHY 910, pipeline 909, DDR PHY 908, and clock/control block 907.

Figure 10:
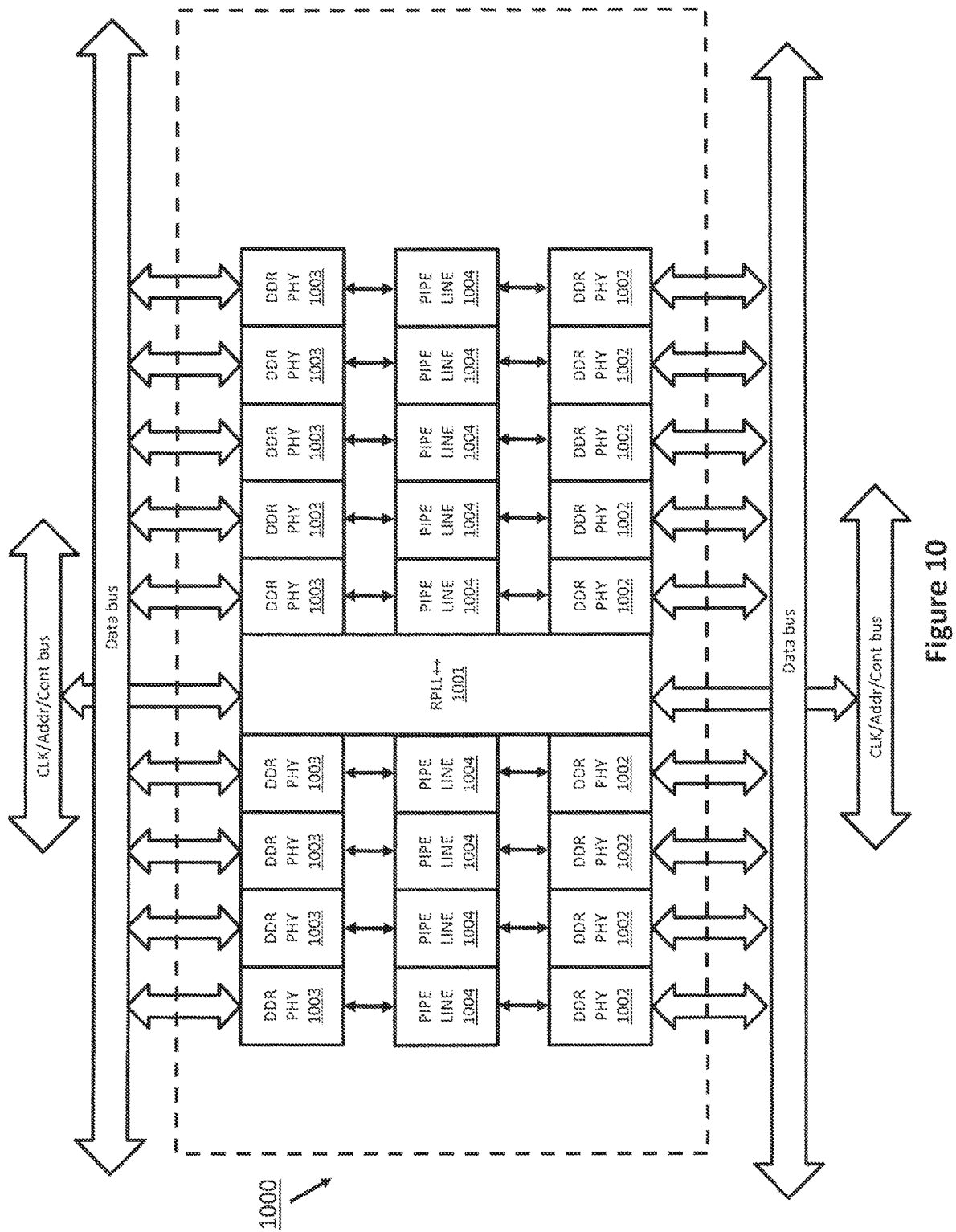
FIG. 10 illustrates an exemplary load-reduced buffer with a timing control for a host side, according to one embodiment.

FIG. 10 illustrates an exemplary load-reduced buffer with a timing control, according to one embodiment. The load-reduced buffer 1000 has a RPLL++1001, DDR PHY blocks 1003 on the DIMM side, pipelines 1004, and DDR PHY blocks 1002 on the host side. The host side DDR PHY blocks 1002 provide the timing control according to the present disclosure. It is noted that a similar DDR PHY design can be used without deviating from the scope of the present disclosure. In some cases, where the controllability of a particular timing relationship is not required, the timing control of the DDR PHY blocks 1002 can implement a fixed phase rather than a controllable variable phase. In FIG. 10, the host side DDR PHY blocks 1002, the pipeline 1004, and the DIMM side DDR PHY blocks 1003 collectively include the programmable RT function.

FIG. 11 illustrates a schematic diagram of an exemplary RT device with a timing control for both a host side and a DIMM side, according to one embodiment. The data path between the DIMM side data bus 1119 and the host side data bus 1109 is essentially the same as the data path used in the CPIO between its external data bus and its internal data bus. It is noted that that the RT device 1100 is an example of an expansive case, and various features or functional blocks may be deleted or substituted if the corresponding capability is not required.

The clock receiver 1102 receives the clock signal line 1101 including the DDR clock and passes the DDR clock to a DLL/PLL 1103 block. The DLL/PLL 1103 block feeds a number of output taps denoted as a programmable delay 1104. Although only three output taps for the programmable delay 1104 are shown in FIG. 11, those output taps are for illustration purposes only. Thus, a different number of output taps may be used depending on the number of distinct clock phases needed in a design. The control bus 1152 and the control block 1106 accept the DDR clock from the clock receiver 1102. The configuration bus 1107 and configuration block 1108 contain various configuration registers that are needed to properly control the RT devices. In general the functions controlled by configuration registers are similar to those of any DRAM and include but are not limited to: termination strength, drive strength, write levelling control, voltage reference control, termination calibration. Additionally timing control settings of the retime are configured with the configuration bus. The configuration bus is bi-directional allowing the controlling function to query the retime to receive status and other information.

The control bus receives the same DDR commands as a DRAM and these commands are used to enable the write data-path 1164, the read data-path 1162. The write data-path 1164 begins with the host side DDR data bus 1109 that contains a data strobe (DQS) and data line (DQ) (1150). Notably, the design shown in FIG. 11 is for a single nibble/byte; however, two or other numbers of nibbles are may be used without deviating from the scope of the disclosed embodiments.

The DQS receiver 1111 and the DQ receiver 1110 are enabled based on a programmable delay for sub-cycle timing and pipelining for clock cycle delays in the control block 1106. For example, the received DQS strobe signal is nominally delayed 90 degrees to center it in the middle of the DQ signals. For a DDR3/DDR4 host controller, the DQS signal arrives properly positioned, and the delay element may be omitted. The control circuit 1113 manages the 4 double data rate flip-flops 1114 that hold the data burst. The use of multiple flip flops 1114 is critical to a properly functioning design over a wide range of process, voltage and temperature. The flip flops 1114 guarantee a long hold period for an individual nibble/byte allowing the signal to propagate through the RT device 1100. The long hold period allows an additional delay to be added between an input and an output to provide the compatibility with another topology DIMM. In this example, four flip-flops 1114 are shown; however, other numbers are acceptable based on the desired maximum delay. The control block 1115 and the multiplexor 1116 select one of the input flip flops 1114 and feed an output DDR flip flop 1114. The control block 1115, MUX 1116 and the output DDR flip-flop 1114 run on the desired programmable output phase. The data is driven out the output drivers DQ 1118 and DQS 1117 onto the DIMM side data bus 1119. There may be a programmable delay 1170 to adjust the DQS timing relative to the data to place it 90 degrees relative to the data to centre it relative to the data.

The read data path is similar to the write data path and starts on the DIMM side data bus 1119 and finishes on the host side bus 1109. The control circuit 1123 manages the 4 double data rate flip-flops 1124 that hold the data burst. The use of multiple flip flops 1124 is critical to a properly functioning design over a wide range of process, voltage and temperature. The flip flops 1124 guarantee a long hold period for an individual nibble/byte allowing the signal to propagate through the RT device 1100. The control block 1125 and the multiplexor 1126 select one of the input flip flops 1124 and feed an output DDR flip flop 1124. The control block mux 1126 and the output DDR flip-flop 1124 run on the desired programmable output phase. The data is driven out the output drivers DQ 1128 and DQS 1127 onto the host side data bus 1109. There may be a programmable delay 1172 to adjust the DQS timing relative to the data. However, where the DQS is to be edged aligned with the DQ, this is not necessary; the programmable delay block 1172 can be omitted, or set to zero.

Although this example shows the RT device is a single port device for use with a single CPIO, the DIMM side logic may be doubled and the multiplexor 1126 widened to add a second port for access to DRAMs.

Figure 12:
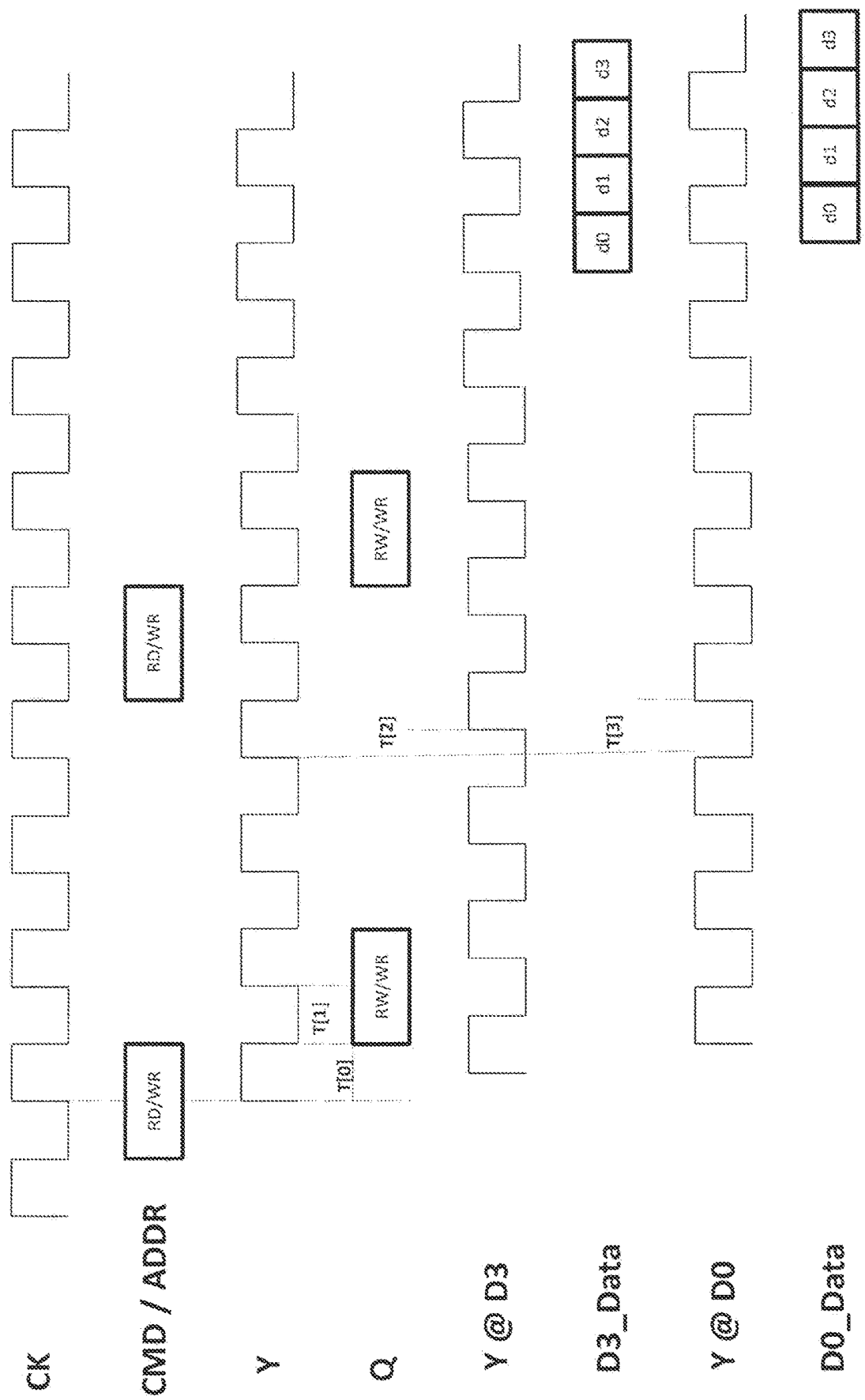
FIG. 12 illustrates an exemplary timing diagram of a read/write operation on an RDIMM or LRDIMM, according to one embodiment.

FIG. 12 illustrates an exemplary timing diagram of a read/write operation on an RDIMM or LRDIMM, according to one embodiment. The control block generates an internal read/write command from the command for a read/write operation received on the address/control bus after a time delay. Based on the programmable time delay received on the DIMM clock and configuration information bus, different time delays T[2] and T[3] are applied. In FIG. 12, CK is the clock input of the DIMM, and CMD/ADDR is the command/address input on the DIMM. Y is the clock output of an RCD/RPLL. Q is the command output of the RCD/RPLL. Y@D3 is the clock a first DRAM. D3_Data is the data at the DRAM. Y@DO is the clock at another DRAM, and DO_Data is the data at the other DRAM. Through the application of the different time delays T[2] and T[3], the timing of the data at the DRAM is different accordingly.

Figure 13:
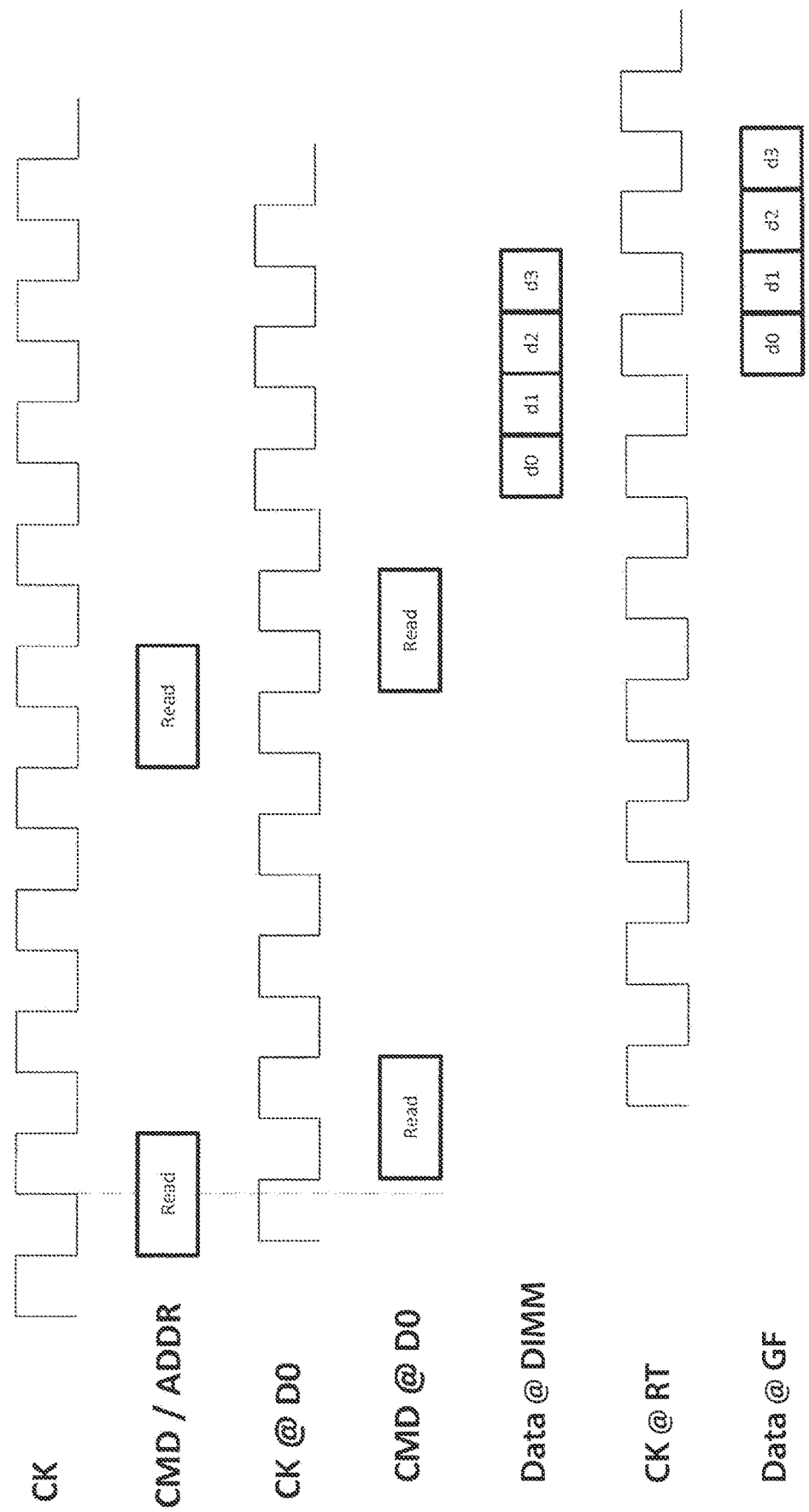
FIG. 13 illustrates an exemplary timing diagram for a read operation in a DIMM utilizing re-timers configured to emulate an RDIMM, according to one embodiment.

FIG. 13 illustrates an exemplary timing diagram of a read operation on an DIMM using re-timers that is configured to be RDIMM compatible, according to one embodiment. In FIG. 13, CK is the clock input of the DIMM, and CMD/ADDR is the command/address input on the DIMM. CK@DO is the clock at a first DRAM. CMD@DO is the command at the first DRAM. Data@DIMM is the data on the DIMM side of the re-timer. Note that there is a small further delay (no shown) from the DIMM side of the re-timer to the DRAM due to propagation delay. CK@RT is the clock at the output of the re-timer. Data@GF is data at the gold finger side of the re-timer.

Figure 14:
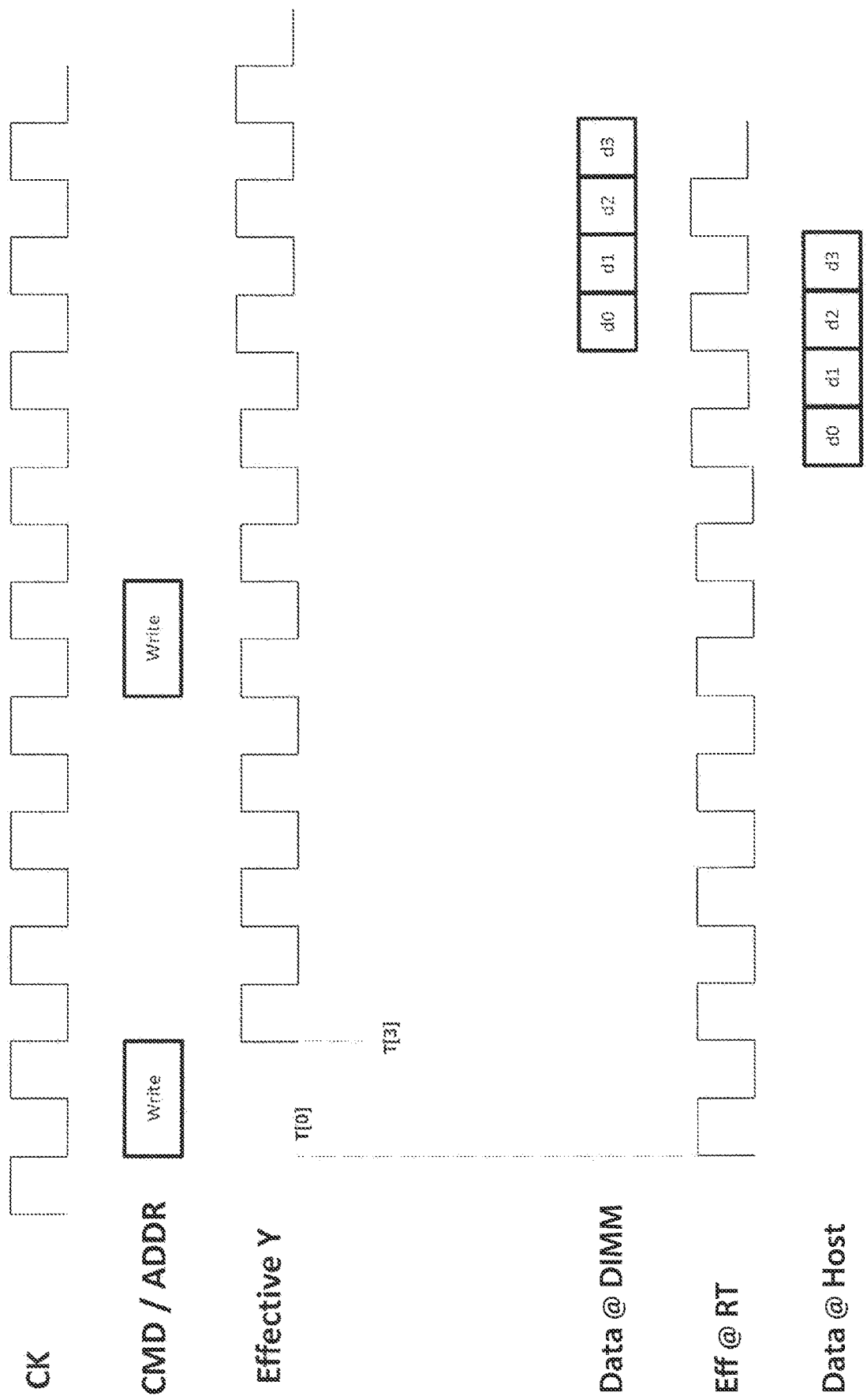
FIG. 14 illustrates an exemplary timing diagram for a read operation in a DIMM utilizing re-timers configured to emulate an RDIMM, according to one embodiment.

FIG. 14 illustrates an timing diagram of a read operation on an DIMM using retimers that is configured to be RDIMM compatible according to one embodiment. Based on the programmable time delay received in the DIMM clock and configuration information bus, the data appears on the data bus with a different time delay. In FIG. 14, CK is the clock input of the DIMM, and CMD/ADDR is the command/address input on the DIMM. CK@DO and CMD@DO have been omitted for clarity but occupy the same place as in FIG. 13. Data@DIMM is the data at the DIMM side of a re-timer. Note that there is a small further delay (not shown) from the DIMM side of the re-timer to the DRAM due to propagation delay. This should also be figured in when determining the delay to apply. Data@GF is data at the gold fingers on the host side of the re-timer. CK RT is effective Y clock at the input of the re-timer Referring again to FIG. 11, it should be understood that the structure illustrated is an example of an RT circuit that might be employed in any of the embodiments described herein. Many specific examples have been provided in the previously described FIGS. 4 to 10. Inputs to the re-timer circuit 1100 circuit on the host side include a clock received on clock line 1101, and DQ,DQS inputs 1150 for write operations. Also shown is a configuration bus 1107 and control bus 1152. Outputs to the host side include DQ and DQS outputs 1154 for read operations. I/O on the DIMM side include DQ and DQS inputs 1156 for read operations, and DQ and DQS outputs 1158 for write operations. Note that DQ/DQS can be bi-directional signals as in the DDR standard but are shown separately for ease of explanation. Depending on the type of DIMM the host is configured to interface with, for a read operation, the timing relationship between the input clock 1101 and the DQS,DQ 1156 received from the DIMM side data bus 1119 may not be consistent with what is expected by the host. The re-timer circuit FIG. 11 provides for a desired timing relationship between the input clock 1101 and the DQ,DQS outputs 1154 for read operations. This desired relationship may be defined by a range of acceptable timing. For example, in a particular conventional RDIMM, there may be delay of 0.6 ns to 1.2 ns through the RPLL, and there may be some variation around the clock edge in the DRAM, for example +−0.5 ns for 1333 RAM. There are also propagation delays in the x and y direction. When all is added together, there a window of time, associated with the clock, within which data is expected. The re-timer circuits provided by embodiments of the invention introduce delay such that an overall delay in a memory module equipped with the re-timer circuit, modulo the clock period, falls substantially within the window of time associated with the clock, within which the data is expected.

For any DIMM, be it a UDIMM, RDIMM, or LRDIMM, there is typically an expected latency or range of latencies. This will vary according to the specific circuit. For example, the UDIMM does not contain an RPLL circuit but only DRAMs which removes one source of delay variation, but the clocking topology of the UDIMM causes the clock to arrive at each DRAM at a different time from one side to the other. For example, an RDIMM differs from a UDIMM in that the RPLL will add another variable delay to the clock signal and the change in clock signal paths means that DRAMs closer to the RPLL and the center of the DIMM will receive their clocks first and the DRAMs at the outer edges of the DIMM will receive their clocks last. For example, an LRDIMM is similar to an RDIMM in every respect except that the addition of the data buffer adds additional delay to the signal path to the DRAM. Thus, all of these examples have different latencies between the host and the DRAM Embodiments of the invention provide for re-timer circuits with programmable delay. However, these circuits have a range of programmability that include a setting that will result in a minimum latency. In order for the re-timer to provide compatibility with a specific DIMM, he expected latency for the specific DIMM needs to be greater than the minimum latency achievable through inclusion of the re-timer circuits. As long as this inequality holds, the re-timer circuit can add delay thus matching the latency of the specific DIMM. In the case of a specific DIMMs the additional delay is different due to the overall differences in signal topology, and component counts. Thus, where UDIMM, RDIMM or LRDIMM compatibility is referred to herein, this does not necessarily refer to such compatibility for any such DIMM, but rather certain DIMMs of these types that satisfy the constraint set out above.

Timing control/clock generation circuit 1160 and read path delay circuit 1162 together are provided for this purpose. Similarly, for a write operation, the timing relationship between the input clock 1101 and the DQS,DQ 1150 received from the host side data bus 1109 is not consistent with what is expected by the DIMM. For example, the host may be configured to communicate with the DIMM as if it is a certain type of DIMM, such as an RDIMM, but the DIMM actually connected is some other type. The re-timer circuit of FIG. 11 provides for a desired timing relationship between the input clock 1101 and the DQ,DQS outputs 1158 for write operations. Timing control/clock generation circuit 1160 and write path delay circuit 1164 together are provided for this purpose.

FIG. 11 illustrates a schematic diagram of an exemplary re-timer device with a timing control for both a host side and a DIMM side, according to one embodiment. This circuit, for example, could be used to implement the RT functionality for the previously described embodiments of FIGS. 4 to 10.

In another embodiment, the functionality of FIG. 11 for the data path between the DIMM side data bus 1119 and the host side data bus 1109 is implemented within a CPIO between its external data bus and its internal data bus. An example of this is shown in FIG. 6, where the CPIO would replicate the functionality for each I/O. It is noted that that the RT device 1100 is an example of an expansive case, and various features or functional blocks may be deleted or substituted if the corresponding capability is not required.

In the illustrated example, timing control/clock generation circuit 1160 includes the clock receiver 1102 which receives the clock signal line 1101. This may, for example be a DDR (double data rate) clock. The clock is passed to a DLL/PLL 1103 block. The DLL/PLL 1103 block feeds a number of output taps denoted as a programmable delay 1104. Although only three output taps for the programmable delay 1104 are shown in FIG. 11, this number of output taps is for illustration purposes only. Thus, a different number of output taps may be used depending on the number of distinct clock phases needed in a design. More generally, any clock generation circuit capable of taking an input clock and generating multiple versions of the input clock with differing delays may be employed. More generally still, any timing control circuit capable of controlling the read path delay circuit and write path delay circuit can be employed.

The control bus 1152 is received by the control block 1106, and configuration bus 1107 is received by configuration block 1108. Both the configuration block 1108 and the control block 1106 accept the clock from the clock receiver 1102. The control block 1106 and configuration block 1108 contain various configuration registers that are used to properly control the RT devices.

The write path starts with DQ RX (DQ receiver) 1110 and DQS RX (DQS receiver) 1111. The output of the DQ RX 1110 is connected in parallel to a plurality of DDR flipflops 1114, four in the illustrated embodiment. If single data rate operation is employed, these would be SDR flipflops. As noted previously, the number of DDR flipflops is implementation dependent. A control block 1113 is connected with respective control inputs to each of the DDR flipflops 1114. The DQS receiver 1111 is connected to a programmable delay element 1112 having an output connected to the control block 1113.

The outputs of the plurality of DDR flipflops are connected to inputs of MUX 1116. There is a further control block 1115 which controls the MUX 1116, and in particular selects which input to pass on to the output of the MUX 1116. The output of the MUX is connected to a DDR flipflop 1166 which in turn is connected to a DQ TX (DQ transmitter) 1118. The control block 1115 is also connected to DQS TX (DQS transmitter) 1117 and enables generation of a correct DQS signal with respect to the DQ signal.

The RX control clock 1113 receives a delayed clock from the clock generation circuit 1160, and generates an enable signal to the DQS receive block 1111.

The DQS receiver 1111 and the DQ receiver 1110 are enabled based on a programmable delay for sub-cycle timing and pipelining for clock cycle delays in the control block 1106. Specifically, the delayed clock received from the timing control/clock generation block 1160 is selected to arrive in the middle of the DQS preamble.

The received DQS output by DQS receiver 1111 is delayed by the programmable delay element 1112, with the objective of aligning DQS transitions with the centre of DQ data pulses to achieve better sampling performance for sampling the data into the DDR flipflops 1114. In some embodiments, the received DQS strobe signal is already nominally delayed 90 degrees so as to be centered in the middle of the DQ signals. For example, for a DDR3/DDR4 host controller, the DQS signal arrives properly positioned, and the delay element may be omitted. However, it can be convenient to include the delay element for full programmability/flexibility, and also such that the read path delay circuit can be made the same as the write path delay circuit.

The control circuit 1113 manages the four double data rate flip-flops 1114 that hold the data burst. The flipflops 1114 and the MUX 1116 together operate as a FIFO (first in first out) buffer. The control circuit 1113 may, for example, enable the flipflops 1114 in a circular manner such that for a set of 8 input bits, the first two bits of the burst go into the first flipflop, the next two go into second flipflop, the next two go into the third flipflop, and the next two go into the last flipflop. Then the process is repeated for the next 8 input bits. The order does not need to be consecutive so long as the same sequential order is used when reading the bits out. The sampling of the input bits is driven by the delayed received DQS signal. The use of multiple flip flops 1114 allows for a properly functioning design over a wide range of process, voltage and temperature. The flip flops 1114 provide a long hold period for an individual nibble/byte allowing the signal to propagate through the RT device 1100. The long hold period allows an additional delay to be added between an input and an output to provide the compatibility with another topology DIMM.

The control block 1115 and the multiplexor 1116 select one of the flip flops 1114 and feeds an output of the selected DDR flip flop 1114 to DDR flipflop 1166. The control block 1115, MUX 1116 and the output DDR flip-flop 1114 run on a selected programmable output phase produced by the timing control/clock generation block 1160. The data is driven out the output drivers DQ 1117 and DQS 1118 onto the DIMM side data bus 1119. The DQS is regenerated, for example in control block 1115, and in some embodiments is delayed by programmable delay block 1170 such that DQS is 90 degrees delayed relative to DQ.

The read path is similar and includes the DQ RX (DQ receiver) 1120 and DQS RX (DQS receiver) 1121. The output of the DQ RX 1120 is connected in parallel to a plurality of DDR flipflops 1124, four in the illustrated embodiment. A control block 1123 is connected with respective control inputs to each of the DDR flipflops 1124. The DQS receiver 1121 is connected to a programmable delay element 1122 having an output connected to the control block 1123.

The outputs of the plurality of DDR flipflops are connected to inputs of MUX 1126. There is a further control block 1125 which controls the MUX 1126, and in particular selects which input to pass on to the output of the MUX 1126. The output of the MUX 1126 is connected to a DDR flipflop 1168 which in turn is connected to a DQ transmitter 1128. The control block 1125 is also connected to DQS TX 1127. Note that the programmable delay block 1172 is set to a zero delay for DDR-3/4 standards but could be set to another value for a different application.

The Rx Control block 1123 receives a delayed clock from the timing control/clock generation circuit 1160, and control block 1125 also receives a (different) delayed clock from the timing control/clock generation circuit 1160.

The DQS receiver 1120 and the DQ receiver 1121 are enabled based on a programmable delay for sub-cycle timing and pipelining for clock cycle delays in the control block 1106. Specifically, the delayed clock received from the timing control/clock generation block 1160 is selected to enable the DQS receiver in the center of the DQS preamble.

The received DQS output by DQS receiver 1120 is delayed by the programmable delay element 1122, with the objective of aligning DQS transitions with the centre of DQ data pulses to achieve better sampling performance. In some embodiments, the received DQS strobe signal from the connected DIMM is nominally aligned with the start of the DQ signals. In this case, the delay element 1122 introduces a 90 degree delay to centre the DQS strobe about the data. The actual delay required is implementation dependent.

The control circuit 1123 manages the 4 DDR flip-flops 1124 that hold the data burst. The flipflops 1124 and the MUX 1126 together operate as a FIFO (first in first out) buffer. The control circuit 1123 may, for example, enable the flipflops 1124 in a circular manner such that for a set of 8 input bits, the first two bits of the burst go into the first flipflop, the next two go into second flipflop, the next two go into the third flipflop, and the next two go into the last flipflop. Then the process is repeated for the next 8 input bits. The sampling of the input bits is driven by the delayed received DQS signal. The use of multiple flip flops 1124 allows for a properly functioning design over a wide range of process, voltage and temperature. The flip flops 1124 provide a long hold period for an individual nibble/byte allowing the signal to propagate through the RT device 1100. The long hold period allows an additional delay to be added between an input and an output to provide the compatibility with another topology DIMM. In this example, four flipflops 1124 are shown; however, other numbers are acceptable based on the desired minimum or maximum delay.

The control block 1125 and the multiplexor 1126 select one of the flip flops 1124 and feeds an output of the selected DDR flip flop 1124 to DDR flipflop 1168. The control block 1125, MUX 1126 and the DDR flip-flop 1168 run on a selected programmable output phase produced by the timing control/clock generation block 1160. The data is driven out the output drivers DQ 1128 and DQS 1127 is regenerated onto the host side data bus 1109. As previously stated the DQS and DQ signals are aligned for DDR-3/4 read operations. Thus the programmable delay block 1172 can be set to add zero delay on the DQS signal.

The phases of the clocks for use in the circuit of FIG. 11 can be determined by doing a timing analysis that produces a desired timing at the output relative to the input. An example will be provided for the read operation, but a similar analysis holds true for the write operation. For the sake of example, assume the objective is to produce a DQS modulo the clock period that is a target delay DT later than the system clock 1101. There is a delay through the circuit 1162 that is a function of:

a. The delay through DQS RX 1120 and DQ RX 1121=D1
b. The programmable delay 1122=D2 is used to guarantee the data is sampled at the optimal point and contributes to the delay through the retime (relative to DQS arrival).
c. The delay through flipflops 1124 (which in turn is a function of the number of DDR flipflops 1124)=D3
d. The delay through flipflop 1124=D4
e. The delay through DQ,DQS transmitter to the gold fingers=D5

Delays D1, D3, D4 and D5 are process, voltage and temperature dependent and the timing control/clock generation circuit 1160 compensate for the changes. Delay D2 is not process, voltage and temperature dependent but is protocol dependent. If the DQS signal is already delayed (centered in the DQ eye) then the delay is relative to the arrival of DQS. If the DQS signal is co-incident with DQ then the centering delay can be considered as part of the delay through the circuit.

The delay at the output is also a function of trace delay=D6 from the memory device to DQS RX 1120 and DQ RX 1121. This delay tends to be invariant to temperature and voltage and there is a small variation due to manufacturing tolerances.

In addition, the delay at the output is a function of the delay the system clock experiences in being delivered to the each re-timer=D7. Depending on the design of the Register/PLL function (RCD or CPIO) D7 will include a mostly invariant transmission delay component and a design/process/voltage/temperature component due to the RCD/CPIO. In general the RCD/CPIO is designed to have a fairly tight tolerance of clock delays and the host is always designed to be able to accommodate the D7 delay and variation.

It is noted that the circuit of FIG. 11 is a specific example, and as such, these delays are specific to that example. The set of delays through the circuit will be a function of the actual implementation.

The timing budget starts with the DIMM type that is to be emulated. For example in a typical RDIMM the main delays are D7 and D5 and the nominal delay for the DRAM is 0 (the actual delay is a range around 0 centered on the rising clock at the DRAM). Note of course that D7 is different for each DRAM position and depending on the topology of the DEV IM D5 may also be different per DRAM. If the goal is to emulate an RDIMM, then data that is launched from the re-timer (for a read) has to arrive at the gold finger at the same time as when it would arrive for a nominal DRAM. At this point the designer works backwards from the pins of the retimer through to the input on the DIMM side through the trace delay to the output launch time of the CPIO (or DRAM). If the total delay is not an integer number of clock cycles, then additional delay is added to the overall path. This delay can be added at the CPIO if it has variable timing control for its data launch, or in the case of a CPIO/DRAM without variable launch control the retime adds the additional delay. Now working forward from the CPIO/DRAM the arrival time of the DQ/DQS signal at the retime is known and hence the settings R4 (receive enable time) can be calculated. The external timing requirement sets the value for R3 within the constraint that the difference between R3 and R4 should be more than the propagation delay through the design.

Although this example shows the RT device is a single port device for use with a single CPIO, the DIMM side logic may be doubled and the multiplexor 1126 widened to add a second port for access to DRAMs.

In the example of FIG. 11, it can be seen that the read path delay circuit is generally the same as the write path delay circuit and they share a common timing control/clock generation circuit 1160. One or both of the write path delay circuit and the read path delay circuit are implemented. More generally, there is a first interface to receive a DIMM clock and configuration information. Configuration information specifying a delay parameter is received via the first interface. The delay parameter can, for example, be representative of a desired delay between output data and the clock. More generally, however, the delay between the output data and the clock will be a function of the delay parameter, as some portions of the delay will be fixed and others variable.

In the illustrated example, the system includes configuration block 1108 which receives configuration information over configuration bus 1107 and clock receiver 1102 which receives the clock 1101. There is a second interface to a first data bus. In the illustrated example, for the read path, the first data bus is the DIMM side data bus 1119, and for the write path, the first data bus is the host side data bus 1109. There is a third interface to a second data bus. In the illustrated example, for the read path, the third interface is to the host side data bus 1109, and for the write path, the third interface is to the DIMM side data bus 1119.

In some embodiments, the delay circuit implements a write path delay between a host side data bus and a DIMM side data bus, as depicted in FIG. 11. In some embodiments, the path delay implements a read path delay between a DIMM side data bus, as depicted in FIG. 11. In the illustrated example, there is a plurality of flip-flops 1124, a multiplexor 1126 coupled to the plurality of flip-flops, a first control block 1123 for controlling to hold an input data within the plurality of flip-flops, and a second control block 1125 for controlling a timing of an output data from the plurality of flip-flops via the multiplexor with a programmable delay. More generally, this functionality can be implemented with any FIFO buffer with programmable output timing The FIFO buffer implements a programmable delay for input data received via the second interface, such that data is sent out with a timing delay based on the programmable delay via the third interface.

The above example embodiments have been described hereinabove to illustrate various embodiments of implementing a system and method for providing a configurable timing control for a memory system. Various modifications and departures from the disclosed example embodiments will occur to those having ordinary skill in the art. The subject matter that is intended to be within the scope of the invention is set forth in the following claims.

What is claimed is:

1. A memory module comprising:
 a non-volatile memory;
 a coprocessor or input-output (CPIO) device coupled to the non-volatile memory, wherein the CPIO device comprises:
  a clock generation circuit to receive a clock signal and output at least one delayed clock signal; and
  a first delay circuit, coupled to the clock generation circuit, the first delay circuit to receive a first data signal and a first data strobe signal, and using the at least one delayed clock signal, generate a delayed first data signal and a first output data strobe signal, wherein the first output data strobe signal has a defined timing relationship with the first delayed data signal and the clock signal.

2. The memory module of claim 1, further comprising:
an address control bus coupled to the CPIO device, wherein the CPIO device is configured to receive address and control signals via the address control bus with a delay relative to the address and control signals exiting the CPIO device.

3. The memory module of claim 1, further comprising a re-timer circuit coupled to the CPIO device, wherein the re-timer circuit comprises a fixed, non-programmable delay circuit to delay the first data strobe signal relative to the first data signal by a fixed delay, wherein the first delay circuit is programmable to delay the first data strobe signal relative to the first data signal by a programmable delay, and wherein the fixed delay and the programmable delay together produce the defined timing relationship.

4. The memory module of claim 1, wherein the first delay circuit is programmable to delay the first data strobe signal relative to the first data signal by a programmable delay to produce the first output data strobe signal.

5. The memory module of claim 4, wherein the programmable delay has a range of programmability such that the defined timing relationship is configurable to be compatible with at least one of a registered DIMM (RDIMM), a load-reduced DIMM (LRDIMM), or an unregistered DIMM (UDIMM).

6. The memory module of claim 1, wherein the first delay circuit comprises:
a plurality of flip-flops that are enabled in sequence based on the first output data strobe signal to store respective pairs of bits of the first data signal;
a multiplexer having inputs coupled to outputs of the plurality of flip-flops and having an output that is from a selected one of the flip-flops;
a first transmitter coupled to the output of the multiplexer that transmits the first delayed data signal;
a second transmitter that transmits the first output data strobe signal; and
a control circuit that controls the multiplexer.

7. The memory module of claim 1, wherein the CPIO device further comprises:
a second delay circuit to receive a second data signal and a second data strobe signal, and using the at least one delayed clock signal, generate a delayed second data signal and a second output data strobe signal, and wherein the second output data strobe signal has a defined timing relationship with the second delayed data signal and the clock signal.

8. The memory module of claim 1, wherein the first delay circuit is configured to connect a data output of the CPIO device to an output of the memory module.

9. The memory module of claim 1, wherein the CPIO device comprises a plurality of data outputs, and wherein a plurality of data buffer circuits connect the plurality of data outputs of the CPIO device to outputs of the memory module.

10. The memory module of claim 1, wherein the CPIO device comprises a plurality of data outputs connected to outputs of the memory module.

11. The memory module of claim 1, further comprising:
a plurality of re-timer circuits coupled to the CPIO device, the CPIO device having a plurality of data outputs, wherein the plurality of re-timer circuits correspond to the plurality of data outputs.

12. A memory module comprising:
a coprocessor or input-output (CPIO) device;
an address control bus coupled to the CPIO device; and
a plurality of re-timer circuits coupled to address control bus, wherein each of the plurality of re-timer circuits comprises a fixed delay, wherein the CPIO device comprises:
a clock generation circuit to receive a clock signal and output at least one delayed clock signal; and
a first delay circuit, coupled to the clock generation circuit, the first delay circuit to receive a first data signal and a first data strobe signal, and using the at least one delayed clock signal, generate a delayed first data signal and a first output data strobe signal, wherein the first output data strobe signal has a defined timing relationship with the first delayed data signal and the clock signal.

13. The memory module of claim 12, further comprising:
a non-volatile memory coupled to the CPIO device.

14. The memory module of claim 12, wherein each of the plurality of re-timer circuits comprises a fixed, non-programmable delay circuit to delay the first data strobe signal relative to the first data signal by the fixed delay, wherein the first delay circuit is programmable to delay the first data strobe signal relative to the first data signal by a programmable delay, and wherein the fixed delay and the programmable delay together produce the defined timing relationship.

15. The memory module of claim 12, wherein the first delay circuit is programmable to delay the first data strobe signal relative to the first data signal by a programmable delay to produce the first output data strobe signal.

16. The memory module of claim 15, wherein the programmable delay has a range of programmability such that the defined timing relationship is configurable to be compatible with at least one of a registered DIMM (RDIMM), a load-reduced DIMM (LRDIMM), or an unregistered DIMM (UDIMM).

17. The memory module of claim 12, wherein the first delay circuit comprises:
a plurality of flip-flops that are enabled in sequence based on the first output data strobe signal to store respective pairs of bits of the first data signal;
a multiplexer having inputs coupled to outputs of the plurality of flip-flops and having an output that is from a selected one of the flip-flops;
a first transmitter coupled to the output of the multiplexer that transmits the first delayed data signal;
a second transmitter that transmits the first output data strobe signal; and
a control circuit that controls the multiplexer.

18. The memory module of claim 12, wherein the CPIO device further comprises:
a second delay circuit to receive a second data signal and a second data strobe signal, and using the at least one delayed clock signal, generate a delayed second data signal and a second output data strobe signal, and wherein the second output data strobe signal has a defined timing relationship with the second delayed data signal and the clock signal.

19. The memory module of claim 12, wherein each of the plurality of re-timer circuits is configured to connect a data output of the CPIO device to an output of the memory module.

20. A memory module comprising:
a non-volatile memory; and
a coprocessor or input-output (CPIO) device coupled to the non-volatile memory, wherein the CPIO device comprises:

means for receiving a clock signal and output at least one delayed clock signal; and means for receiving a first data signal and a first data strobe signal, and using the at least one delayed clock signal, generating a delayed first data signal and a first output data strobe signal, wherein the first output data strobe signal has a defined timing relationship with the first delayed data signal and the clock signal.

* * * * *